United States Patent
Lim

(10) Patent No.: US 10,818,710 B2
(45) Date of Patent: Oct. 27, 2020

(54) IMAGE SENSOR INCLUDING AN EXTRA TRANSFER GATE AND AN EXTRA FLOATING DIFFUSION REGION

(71) Applicant: SK hynix Inc., Gyeonggi-do (KR)

(72) Inventor: Sung-Woo Lim, Gangwon-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/219,461

(22) Filed: Dec. 13, 2018

(65) Prior Publication Data

US 2019/0341411 A1    Nov. 7, 2019

(30) Foreign Application Priority Data

May 2, 2018   (KR) .......................... 10-2018-0050654

(51) Int. Cl.
*H01L 27/146*   (2006.01)
*H04N 5/3745*   (2011.01)

(52) U.S. Cl.
CPC .. *H01L 27/14614* (2013.01); *H01L 27/14607* (2013.01); *H01L 27/14643* (2013.01); *H04N 5/37455* (2013.01)

(58) Field of Classification Search
CPC .................. H01L 27/14; H01L 27/146; H01L 27/14603; H01L 27/14607; H01L 27/14614; H01L 27/14641; H01L 27/14643

USPC ......................................................... 257/292
See application file for complete search history.

(56) References Cited

U.S. PATENT DOCUMENTS

| | | | |
|---|---|---|---|
| 9,712,765 B2 | 7/2017 | Funatsu et al. | |
| 2016/0268322 A1* | 9/2016 | Watanabe | H01L 27/14614 |
| 2017/0047365 A1 | 2/2017 | Tatani et al. | |
| 2019/0148448 A1* | 5/2019 | Lee | H01L 27/14612 |
| | | | 257/431 |

* cited by examiner

*Primary Examiner* — Fazli Erdem
(74) *Attorney, Agent, or Firm* — Perkins Coie LLP

(57) ABSTRACT

An image sensor may include a pixel array including different pixel blocks where a pixel block includes a block of adjacent unit pixels each unit responsive to light to produce photo-generated charges, a floating diffusion region disposed at a center of each unit pixel to receive the photo-generated charges, and transfer gates formed between the floating diffusion region and the unit pixel to control the transfer of the photo-generated charges. Each the pixel block may include an extra floating diffusion region at a center of the pixel block to interface with each of the adjacent unit pixels with the pixel block to photo-generated charges from each of the adjacent unit pixels and extra transfer gates that are formed between the extra floating diffusion region and the adjacent unit pixels to control the transfer of the photo-generated charges from the adjacent unit pixels to the extra floating diffusion region.

20 Claims, 16 Drawing Sheets

IMAGE SENSOR INCLUDING AN EXTRA TRANSFER GATE AND AN EXTRA FLOATING DIFFUSION REGION

CROSS-REFERENCE TO RELATED APPLICATION

This patent document claims priority under 35 U.S.C. § 119 to Korean Patent Application No. 10-2018-0050654 filed on May 2, 2018, which is incorporated herein by reference in its entirety.

TECHNICAL FIELD

The technology and implementations disclosed in this patent document relate to an image sensor including transfer gates (transistors) and a floating diffusion region.

BACKGROUND

With the recent development of the information communication industry and the digitalization of electronic devices, image sensors with improved performance have been used in various fields such as a digital camera, a camcorder, a mobile phone, a PCS (personal communication system), a game machine, security camera and a medical micro camera. In general, an image sensor includes a plurality of pixel blocks having unit pixels which are arranged in rows and columns. Each of the unit pixels includes photodiodes and transfer gates (transistors). The transfer gates (transistors) are disposed between the photodiodes and a floating diffusion region, and transfer the photo-charges generated in the photodiodes to the floating diffusion region.

SUMMARY

Various embodiments provide an image sensor which is designed to have and, operates in, different modes including a first mode and a second mode to improve the imaging performance. In the examples provided below, such an image sensor can be operated either on the first mode or the second mode depending on an amount of light received by the image sensor.

Various embodiments provide an image sensor which includes transfer gates (transistors) and a floating diffusion region operating in the first mode and transfer gates (transistors) and a floating diffusion region operating in the second mode.

Various embodiments provide pixel blocks of an image sensor which operates in the first mode and the second mode.

Various embodiments provide pixel blocks of an image sensor which includes transfer gates (transistors) and a floating diffusion region operating in the first mode and transfer gates (transistors) and a floating diffusion region operating in the second mode.

In an embodiment, an image sensor may include a pixel array structured to include different pixel blocks for capturing incident light where a pixel block includes a block of adjacent unit pixels each unit responsive to light to produce photo-generated charges, a floating diffusion region disposed at a center of each unit pixel to receive the photo-generated charges, and transfer gates formed between the floating diffusion region and the unit pixel to control the transfer of the photo-generated charges. Each the pixel block may include an extra floating diffusion region at a center of the pixel block to interface with each of the adjacent unit pixels with the pixel block to photo-generated charges from each of the adjacent unit pixels and extra transfer gates that are formed between the extra floating diffusion region and the adjacent unit pixels to control the transfer of the photo-generated charges from the adjacent unit pixels to the extra floating diffusion region.

In an embodiment, an image sensor may include a pixel block including first to fourth unit pixels which are arranged in rows and columns and extra elements which are disposed at a center of the pixel block. The first unit pixel may include first to fourth photosensing elements, first to fourth transfer gates, and a first floating diffusion region. The second unit pixel may include first to fourth photosensing elements, first to fourth transfer gates, and a second floating diffusion region. The third unit pixel may include first to fourth photosensing elements, first to fourth transfer gates, and a third floating diffusion region. The fourth unit pixel may include first to fourth photosensing elements, first to fourth transfer gates, and a fourth floating diffusion region, the first to fourth photosensing elements structured to receive light, and generate photo-charges in response to the reception of light and the first to fourth transfer gates structured to transfer the generated photo-charges to the first to the fourth floating diffusion regions. The extra elements may include a first extra transfer gate overlapping with the first unit pixel, a second extra transfer gate overlapping with the second unit pixel, a third extra transfer gate overlapping with the third unit pixel, a fourth extra transfer gate overlapping with the fourth unit pixel, and an extra floating diffusion region disposed at a center of the pixel block.

In an embodiment, an image sensor may include first to fourth unit pixels arranged in rows and columns, each of the first to fourth unit pixels including photosensing elements structured to detect light and generate photo-charges in a first mode and a floating diffusion region structured to store the generated photo-charges, and a fifth unit pixel disposed to overlap with the first to fourth unit pixels. Some of the photosensing elements of the first to fourth unit pixels may be included in the fifth unit pixel to detect light and generate photo-charges in a second mode different from the first mode. The fifth unit pixel may include a floating diffusion region which is disposed at a center of the some of the photosensing elements.

Since the image sensors according to the embodiments of the disclosed technology may operate independently in a high illumination mode and a low illumination mode, it is possible to obtain a high signal-to-noise ratio, in particular, in the low illumination mode.

Since the image sensors according to the embodiments of the disclosed technology use a floating diffusion region which is sufficiently separated from an isolation region, in the low illumination mode, a dark current characteristic may be improved.

In an embodiment, an image sensor may include: a pixel block including first to fourth unit pixels which are arranged in a first matrix form and extra elements which are disposed at a center of the first matrix form. The first to fourth unit pixels may include first to fourth photodiodes which are arranged in second matrix forms, first to fourth transfer transistors which overlap with the first to fourth photodiodes, respectively, and floating diffusion regions which are disposed at centers of the second matrix forms. The extra elements may include a central extra floating diffusion region and first to fourth extra transfer transistors which are arranged in a radiation type.

In an embodiment, an image sensor may include: a pixel block including first to fourth unit pixels which are arranged in a matrix form and extra elements which are disposed at a center of the matrix form. The first unit pixel may include first to fourth photodiodes, first to fourth transfer transistors and a first floating diffusion region. The second unit pixel may include first to fourth photodiodes, first to fourth transfer transistors and a second floating diffusion region. The third unit pixel may include first to fourth photodiodes, first to fourth transfer transistors and a third floating diffusion region. The fourth unit pixel may include first to fourth photodiodes, first to fourth transfer transistors and a fourth floating diffusion region. the extra elements may include a first extra transfer transistor overlapping with the first unit pixel; a second extra transfer transistor overlapping with the second unit pixel; a third extra transfer transistor overlapping with the third unit pixel; a fourth extra transfer transistor overlapping with the fourth unit pixel; and an extra floating diffusion region disposed at a center of the first to fourth extra transfer transistors.

In an embodiment, an image sensor may include: first to fourth unit pixels arranged in a matrix form; and a fifth unit pixel disposed among the first to fourth unit pixels. The first unit pixel may include a plurality of first photodiodes and a first floating diffusion region. The second unit pixel may include a plurality of second photodiodes and a second floating diffusion region. The third unit pixel may include a plurality of third photodiodes and a third floating diffusion region. The fourth unit pixel may include a plurality of fourth photodiodes and a fourth floating diffusion region. The fifth unit pixel may include a fifth floating diffusion region which shares one of the first photodiodes, one of the second photodiodes, one of the third photodiodes and one of the fourth photodiodes and is disposed at a center of the ones of the first to fourth photodiodes.

Other advantages according to various embodiments of the disclosed technology have been described in the text.

DETAILED DESCRIPTION

Figure 1:
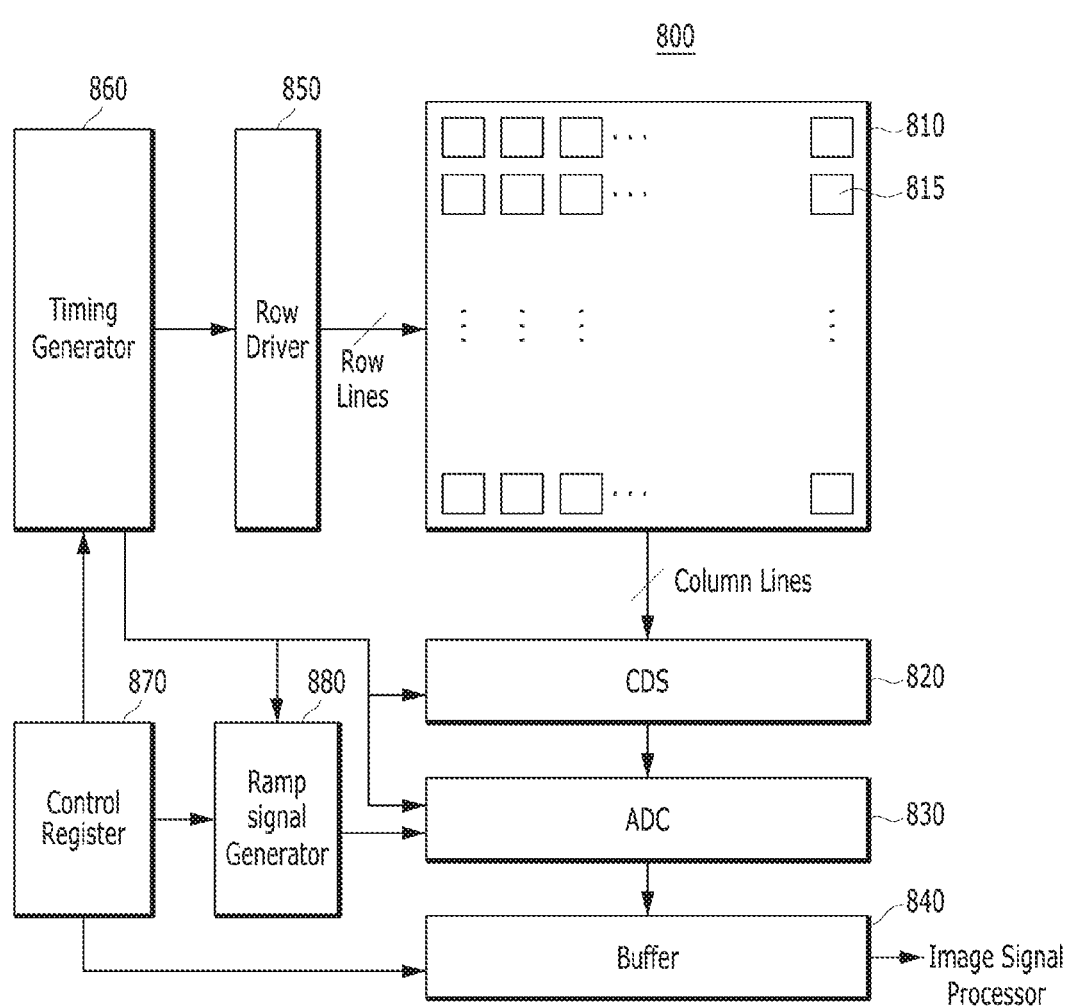
FIG. 1 is a block diagram schematically illustrating a representation of an example of an image sensor in accordance with an embodiment of the disclosed technology.

The disclosed technology can be implemented to provide an image sensor including pixel structures operated during a first mode and additional pixel structured operated during a second mode different from the first mode. By separately and independently operating the corresponding pixel structures of the image sensor, the disclosed technology can provide an image sensor with improved characteristics including a high signal-to-noise ratio and low dark current characteristics.

In the present disclosure, advantages, features and methods for achieving them will become more apparent after a reading of the following exemplary embodiments taken in conjunction with the drawings.

Throughout the specification, like reference numerals refer to like elements. Therefore, although the same or similar reference numerals are not mentioned or described in a corresponding drawing, the reference numerals may be described with reference to other drawings. Furthermore, although elements are not represented by reference numerals, the elements may be described with reference to other drawings. In the present disclosure, "gate(s)" and "transistor(s)" may be used as the same elements as or similar to each other.

FIG. 1 is a block diagram schematically illustrating a representation of an example of an image sensor 800 in accordance with an embodiment of the disclosed technology. Referring to FIG. 1, the image sensor 800 in accordance with the embodiment of the disclosed technology may include a pixel array 810 in which a plurality of pixels are arranged in a matrix structure, a correlated double sampler (CDS) 820, an analog-digital converter (ADC) 830, a buffer 840, a row driver 850, a timing generator 860, a control register 870, and a ramp signal generator 880.

The pixel array 810 may include a plurality of pixel blocks 815 which are arranged in a matrix structure including columns and rows of pixels. Each pixel may be implemented by a photo sensing device or circuit that produce an electrical signal in response to received light, including, e.g., a photodiode, a photo transistor, a photo gate, or other photosensitive circuitry capable of converting light into a pixel signal (e.g., a charge, a voltage or a current). Each of the plurality of pixel blocks 815 may convert an optical image information into an electrical image signal and transmit the electrical image signal to the CDS 820 through a corresponding column line. Each of the plurality of pixel blocks 815 may be coupled with one of row lines and one of column lines.

The CDS 820 may hold and sample the electrical image signals which are received from the pixels of pixel blocks 815 within the pixel array 810. For example, the CDS 820 may sample a reference voltage level and the voltage level of a received electrical image signal from one pixel block 815 according to a clock signal provided from the timing generator 860 and transmit an analog signal corresponding to the difference therebetween to the ADC 830.

The ADC 830 may convert the received analog signal into a digital signal representing the electrical image signal from a particular pixel blocks 815 and transmit the digital signal to the buffer 840.

The buffer 840 may latch or hold the received digital signal and output the latched or held digital signal to an image signal processor (not shown). The buffer 840 may include a memory for latching a digital signal and a sense amplifier for amplifying the digital signal.

The row driver 850 may drive the plurality of pixels of the pixel array 810 according to a signal of the timing generator 860. For example, the row driver 850 may generate select signals for selecting one of the plurality of row lines and/or driving signals for driving one of the plurality of row lines.

The timing generator 860 may generate a timing signal for controlling the CDS 820, the ADC 830, the row driver 850 and the ramp signal generator 880.

The control register 870 may generate control signals for controlling the buffer 840, the timing generator 860 and the ramp signal generator 880.

The ramp signal generator 880 may generate a ramp signal for controlling an image signal outputted from the buffer 840, according to control of the timing generator 860.

Figure 2:
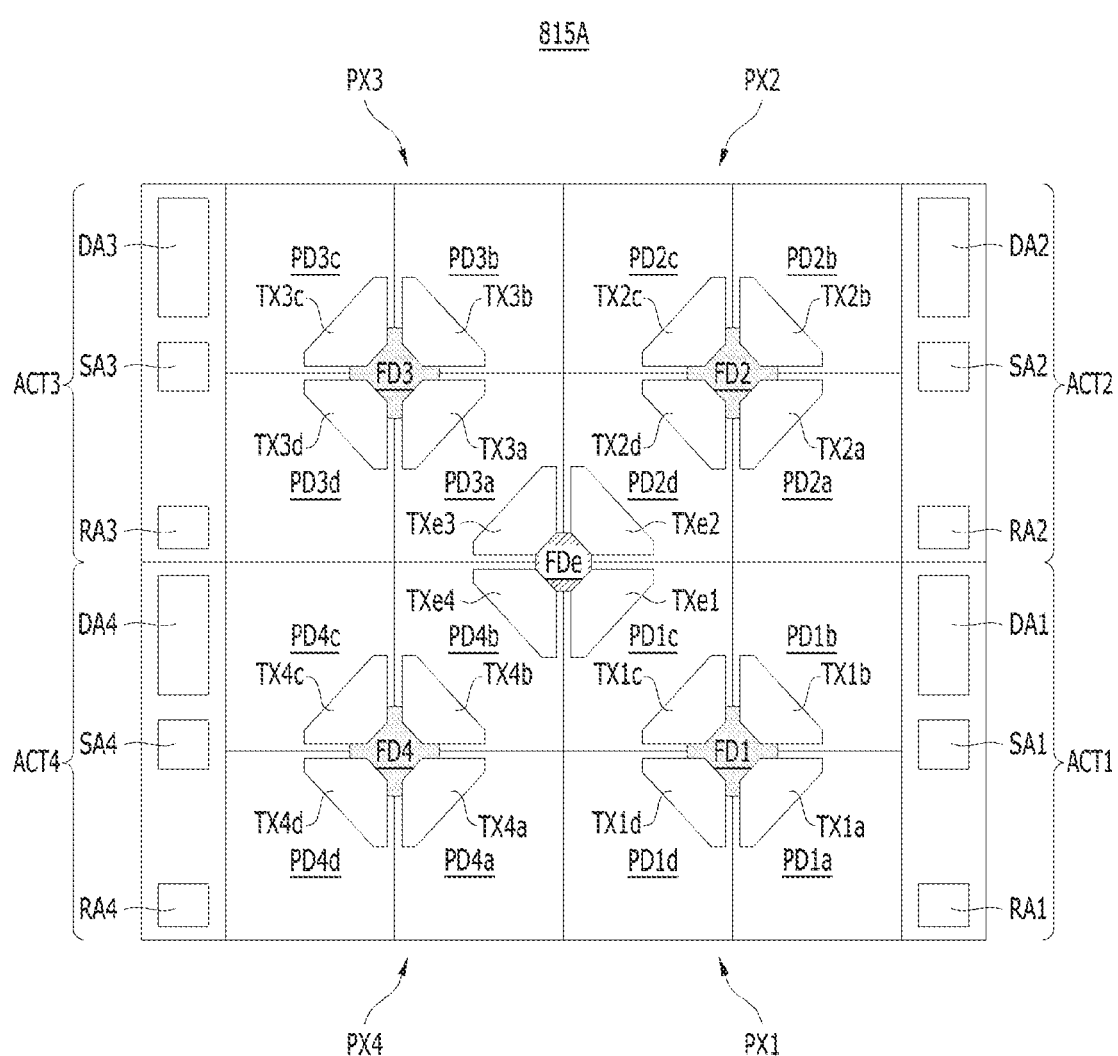
FIG. 2 is a schematic layout diagram illustrating a representation of an example of the pixel block of an image sensor in accordance with an embodiment of the disclosed technology.

FIG. 2 is a schematic layout diagram illustrating a representation of an example of a pixel block 815A of pixels within a pixel array 810 of an image sensor 800 in accordance with an embodiment. Referring to FIGS. 1 and 2, the pixels in the pixel array 810 of the image sensor 800 in accordance with the embodiment of the disclosed technology may be structured to include a plurality of pixel blocks 815 arranged in rows and columns as shown in FIG. 1 and the pixel block 815A shows an example of different adjacent pixels based on a shared floating diffusion region architecture for such a pixel block 815. In the example in FIG. 2, each of the pixel blocks 815A may include first to fourth unit pixels PX1 to PX4 which are arranged in a matrix form in rows and columns, and each of the first to fourth unit pixels PX1 to PX4 may include segmented photosensing regions (e.g., photodiode regions PD1*a*, PD1*b*, PD1*c*, and PD1*d*) for receiving incident light for producing photo-generated charges, a floating diffusion region FD (e.g., FD1, FD2, FD3, and FD4) located adjacent to the photosensing regions, and transfer gates (transistors) TX surrounding a corresponding floating diffusion region FD TX3*a*, TX3*b*, TX3*c*, and TX3*d* sharing the floating region FD3) to transfer photo-generated charges from the photosensing regions to the corresponding floating diffusion region FD for the unit pixels PX1, PX2, PX3 and PX4. Each unit pixel PX1, PX2, PX3 or PX4 within the illustrated pixel block 815A may include a corresponding active region ACT with transistors (e.g., ACT1, ACT2, ACT3, and ACT4) for processing photo-generated charges in that unit pixel to produce an output unit pixel signal. In this example, the pixel block 815A may further include an extra floating diffusion region FDe which is disposed at the center of the pixel block 815A and shared by the four unit pixels PX1, PX2, PX3, and PX4, and extra transfer gates (transistors) TXe1, TXe2, TXe3, and TXe4 for transferring photo-generated charges in a photosensing region (e.g., a photodiode) to the extra floating diffusion region FDe.

In the example as shown in FIG. 2, the floating diffusion regions FD1 to FD4 of the first to fourth unit pixels PX1 to PX4 may be radially disposed around the extra floating diffusion region FDe. In this case, the extra floating diffusion region FDe is disposed at a center of the floating diffusion regions FD1 to FD4. For example, the pixel block 815A may include the first unit pixel PX1 which is arranged at a right bottom of the pixel block 815A, the second unit pixel PX2 which is arranged at a right top of the pixel block 815A, the third unit pixel PX3 which is arranged at a left top of the pixel block 815A, the fourth unit pixel PX4 which is arranged at a left bottom of the pixel block 815A, and the extra elements TXe1 to TXe4 and FDe that are disposed at a center of the pixel block 815A. The right bottom, the right top, the left top and the left bottom may be changed depending on a rotation of the drawing.

The first unit pixel PX1 may include first photodiodes PD1*a* to PD1*d* and first transfer gates TX1*a* to TX1*d* which are arranged in different portions of the first unit pixel PX1. In some implementations, the first photodiodes PD1*a* to PD1*d* and the first transfer gates TX1*a* to TX1*d* may be radially disposed around the first floating diffusion region FD1. In this case, the first floating diffusion region FD1 is disposed at the center of the first unit pixel PX1. For example, the first unit pixel PX1 may include the photodiode PD1*a* and the transfer gate TX1*a* that are arranged at a right bottom of the first unit pixel PX1, the photodiode PD1*b* and the transfer gate TX1*b* that are arranged at a right top of the first unit pixel PX1, the photodiode PD1*c* and the transfer gate TX1*c* that are arranged at a left top of the first unit pixel PX1, the photodiode PD1*d* and the transfer gate TX1*d* that are arranged at a left bottom of the first unit pixel PX1, and the first floating diffusion region FD1 which is disposed at a center of the first unit pixel PX1. The first photodiodes PD1*a* to PD1*d* of the first unit pixel PX1 may share the first floating diffusion region FD1 through the first transfer gates TX1*a* to TX1*d*, respectively. The first unit pixel PX1 may further include a first active region ACT1 which is disposed on the outer surface or side thereof. In some implementations, the first active region ACT1 may be disposed opposite to the fourth unit pixel PX4. For example, the first active region ACT1 of the first unit pixel PX1 may be disposed on a right side of the first unit pixel which is adjacent to the photodiodes PD1*a* and PD1*b* of the first unit pixel PX1.

The second unit pixel PX2 may include second photodiodes PD2*a* to PD2*d* and second transfer gates TX2*a* to TX2*d* which are arranged in different portions of the second unit pixel PX2. In some implementations, the second photodiodes PD2*a* to PD2*d* and the second transfer gates TX2*a* to TX2*d* may be radially disposed around the second floating diffusion region FD2. In this case, the second floating diffusion region FD2 is disposed at the center of the second unit pixel PX2. For example, the second unit pixel PX2 may include the photodiode PD2*a* and the transfer gate TX2*a* that are arranged at a right bottom of the second unit pixel PX2, the photodiode PD2*b* and the transfer gate TX2*b* that are arranged at a right top of the second unit pixel PX2, the photodiode PD2*c* and the transfer gate TX2*c* that are arranged at a left top of the second unit pixel PX2, the photodiode PD2*d* and the transfer gate TX2*d* that are arranged at a left bottom of the second unit pixel PX2, and the second floating diffusion region FD2 which is disposed at a center of the second unit pixel PX2. The second photodiodes PD2*a* to PD2*d* of the second unit pixel PX2 may share the second floating diffusion region FD2 through the second transfer gates TX2*a* to TX2*d*, respectively. The second unit pixel PX2 may further include a second active region ACT2 which is disposed on the outer surface or side thereof. In some implementations, the second active region ACT2 may be disposed opposite to the third unit pixel PX3. For example, the second active region ACT2 of the second unit pixel PX2 may be disposed on a right side of the second unit pixel PX2 which is adjacent to the photodiodes PD2*a* and PD2*b* of the second unit pixel PX2.

The third unit pixel PX3 may include third photodiodes PD3*a* to PD3*d* and third transfer gates TX3*a* to TX3*d* which are arranged in different portions of the third unit pixel PX3. In some implementations, the third photodiodes PD3*a* to PD3*d* and the third transfer gates TX3*a* to TX3*d* may be radially disposed around the third floating diffusion region FD3. In this case, the third floating diffusion region is disposed at the center of the third unit pixel PX3. For example, the third unit pixel PX3 may include the photodiode PD3*a* and the transfer gate TX3*a* that are arranged at a right bottom of the third unit pixel PX3, the photodiode PD3*b* and the transfer gate TX3*b* that are arranged at a right top of the third unit pixel PX3, the photodiode PD3*c* and the transfer gate TX3*c* that are arranged at a left top of the third unit pixel PX3, the photodiode PD3*d* and the transfer gate TX3*d* that are arranged at a left bottom of the third unit pixel PX3, and the third floating diffusion region FD3 which is disposed at a center of the third unit pixel PX3. The third photodiodes PD3*a* to PD3*d* of the third unit pixel PX3 may share the third floating diffusion region FD3 through the third transfer gates TX3*a* to TX3*d*, respectively. The third unit pixel PX3 may further include a third active region ACT3 which is disposed on the outer surface or side thereof. In some implementations, the third active region ACT3 may be disposed opposite to the second unit pixel PX2. For example, the third active region ACT3 of the third unit pixel PX3 may be disposed on a left side of the third unit pixel PX3 which is adjacent to the photodiodes PD3*c* and PD3*d* of the third unit pixel PX3.

The fourth unit pixel PX4 may include fourth photodiodes PD4*a* to PD4*d* and fourth transfer gates TX4*a* to TX4*d* which are arranged in different portions of the fourth unit pixel PX4. In some implementations, the fourth photodiodes PD4*a* to PD4*d* and the fourth transfer gates TX4*a* to TX4*d* may be radially disposed around the fourth floating diffusion region FD4. In this case, the fourth floating diffusion region FD4 is disposed at the center of the fourth unit pixel PX4. For example, the fourth unit pixel PX4 may include the photodiode PD4*a* and the transfer gate TX4*a* that are arranged at a right bottom of the fourth unit pixel PX4, the photodiode PD4*b* and the transfer gate TX4*b* that are arranged at a right top of the fourth unit pixel PX4, the photodiode PD4*c* and the transfer gate TX4*c* that are arranged at a left top of the fourth unit pixel PX4, the photodiode PD4*d* and the transfer gate TX4*d* which are arranged at a left bottom of the fourth unit pixel PX4, and the fourth floating diffusion region FD4 which is disposed at a center of the fourth unit pixel PX4. The fourth photodiodes PD4*a* to PD4*d* of the fourth unit pixel PX4 may share the fourth floating diffusion region FD4 through the fourth transfer gates TX4*a* to TX4*d*, respectively. The fourth unit pixel PX4 may further include a fourth active region ACT4 which is disposed on the outer surface or side thereof. In some implementations, the fourth active region ACT4 may be disposed opposite to the first unit pixel PX1. For example, the fourth active region ACT4 of the fourth unit pixel PX4 may be disposed on a left side of the fourth unit pixel PX4 which is adjacent to the photodiodes PD4*c* and PD4*d* of the fourth unit pixel PX4.

As illustrated in the example in FIG. 2, the extra elements TXe1 to TXe4 and FDe may be disposed at the center of the pixel block 815A. The extra elements TXe1 to TXe4 and FDe may include first to fourth extra transfer gates TXe1 to TXe4 which are radially arranged around the extra floating diffusion region FDe. In the illustrated example, the extra floating diffusion region FDe is disposed at a center of the pixel block 815A. For example, the extra elements TXe1 to TXe4 and FDe may include the first extra transfer gate TXe1 which is arranged in the first unit pixel PX1, the second extra transfer gate TXe2 which is arranged in the second unit pixel PX2, the third extra transfer gate TXe3 which is arranged in the third unit pixel PX3, the fourth extra transfer gate TXe4 which is arranged in the fourth unit pixel PX4, and the extra floating diffusion region FDe which is disposed at the center of the pixel block 815A. In some implementations, the first extra transfer gate TXe1 is arranged at a right bottom of the extra floating diffusion region FDe to overlap with the first photodiode PD1*c* disposed at the left top of the first unit pixel PX1, the second extra transfer gate TXe2 is arranged at a right top of the extra floating diffusion region FDe to overlap with the second photodiode PD2*d* disposed at the left bottom of the second unit pixel PX2, the third extra transfer gate TXe3 is arranged at a left top of the extra floating diffusion region FDe to overlap with the third photodiode PD3*a* disposed at the right bottom of the third unit pixel PX3, and the fourth extra transfer gate TXe4 is arranged at a left bottom of the extra floating diffusion region FDe to overlap with the fourth photodiode PD4*b* disposed at the right top of the fourth unit pixel PX4.

Therefore, the pixel block 815A in accordance with the embodiment of the disclosed technology may be regarded as providing an extra unit pixel in addition to the first to fourth unit pixels PX1 to PX4. For example, the first unit pixel PX1 may include the four first photodiodes PD1*a* to PD1*d*, the four first transfer gates TX1*a* to TX1*d*, and the first floating diffusion region FD1, the second unit pixel PX2 may include the four second photodiodes PD2*a* to PD2*d*, the four second transfer gates TX2*a* to TX2*d*, and the second floating diffusion region FD2, the third unit pixel PX3 may include the four third photodiodes PD3*a* to PD3*d*, the four third transfer gates TX3*a* to TX3*d*, and the third floating diffusion region FD3, the fourth unit pixel PX4 may include the four fourth photodiodes PD4*a* to PD4*d*, the four fourth transfer gates TX4*a* to TX4*d*, and the fourth floating diffusion region FD4, and a fifth unit pixel (not numbered) may include the first photodiode PD1*c*, the second photodiode PD2*d*, the third photodiode PD3*a*, the fourth photodiode PD4*b*, the four first to fourth extra transfer gates TXe1 to TXe4, and the extra floating diffusion region FDe. That is to say, the first photodiode PD1*c* may be shared by the first transfer gate TX1*c* and the first extra transfer gate TXe1, the second photodiode PD2*d* may be shared by the second transfer gate TX2*d* and the second extra transfer gate TXe2, the third photodiode PD3*a* may be shared by the third transfer gate TX3*a* and the third extra transfer gate TXe3, and the fourth photodiode PD4*b* may be shared by the fourth transfer gate TX4*b* and the fourth extra transfer gate TXe4.

Each of the first to fourth floating diffusion regions FD1 to FD4 may be equal to or larger than the extra floating diffusion region FDe. The first to fourth transfer gates TX1*a* to TX4*d* of the first to fourth unit pixels PX1 to PX4 may be equal to or larger than the first to fourth extra transfer gates TXe1 to TXe4.

Each of the first to fourth active regions ACT1 to ACT4 may be arranged on one side of a corresponding one of the first to fourth unit pixels PX1 to PX4. The first to fourth active regions ACT1 to ACT4 may include some transistors which function to convert accumulate photo-generated charges (e.g., electron charges) which are generated from the first to fourth pixel units to measurable voltages, resets the photodiodes, and transfers the voltages to corresponding column lines. Each of the first to fourth active regions ACT1 to ACT4 includes one of first to fourth reset active regions RA1 to RA4 for reset transistors, one of first to fourth drive active regions DA1 to DA4 for drive transistors, and one of first to fourth selection active regions SA1 to SA4 for selection transistors. First to fourth reset transistors RX1 to RX4 of FIGS. 3A to 3C may be disposed on the first to fourth reset active regions RA1 to RA4, first to fourth drive transistors DX1 to DX4 of FIGS. 3A to 3C may be disposed on the first to fourth drive active regions DA1 to DA4, and first to fourth selection transistors SX1 to SX4 of FIGS. 3A to 3C may be disposed on the first to fourth selection active regions SA1 to SA4.

The image sensor 800 in accordance with the embodiment of the disclosed technology may perform operations which run in two different modes including a first mode and a second mode. For example, in the first mode, the first to fourth unit pixels PX1 to PX4 may operate independently from one another, and the extra elements TXe1 to TXe4 and FDe may be deactivated so that the extra floating diffusion region FDe does not receive photo-generated charges from the surrounding unit pixels PX1, PX2, PX3, and PX4. In other words, in the first mode, the pixel block 815A may operate with four unit pixels PX1 to PX4 to export signals representing photosensing results of the pixel block 815A based on accumulated photo-generated charges in the four floating diffusion regions FD1, FD2, FD3, and FD4 without using any charges in the extra floating diffusion region FDe.

In contrast, in the second mode, the transfer transistors TX surrounding each of the floating diffusion regions FD1, FD2, FD3, and FD4 (e.g., TX1a, TX1b, TX1c, and TX1d sharing the first floating region FD1, TX2a, TX2b, TX2c, and TX2d sharing the second floating region FD2, TX3a, TX3b, TX3c, and TX3d sharing the third floating region FD3, and TX4a, TX4b, TX4c, and TX4d sharing the fourth floating region FD4) are deactivated, and the extra elements TXe1 to TXe4 may be activated to operate to allow the photo-generated charges in the photosensing regions of the unit pixels PX1, PX2, PX3, and PX4 to be transferred into the extra floating diffusion region FDe to represent the photosensing results of the entire pixel block 815A. In other words, in the second mode, the pixel block 815A may operate as one pixel unit via the single extra floating diffusion region FDe and its corresponding transfer transistors TXe1, TXe2, TXe3, and TXe4. The first mode may be operated to detect incident scenes under a bright illumination condition as a bright mode or a high illumination mode in which an amount of received light is sufficient (e.g., an outdoor imaging condition where outdoor lighting is bright during most daytime), and the second mode may be operated to performing imaging operations in a dark mode or a low illumination mode in which an amount of received light is relatively small, such as in some indoor or night imaging conditions.

In the high illumination mode, a high resolution image capturing operation may be performed by using the first to fourth floating diffusion regions FD1 to FD4. In the low illumination mode, a precise image capturing operation may be performed by using the extra floating diffusion region FDe. Each of the first to fourth floating diffusion regions FD1 to FD4 has its own interfacing borders with the photosensing regions of the surrounding unit pixels PX1, PX2, PX3, and PX4, respectively, and thus such interfacing borders can cause a potential loss of photo-generated charges when being transferred via the respective transfer transistors. In the first mode, the total loss of the photo-generated charges at the four floating diffusion regions FD1, FD2, FD3, and FD4 may be approximately four times of the loss in one region. Assuming the structure of the extra floating diffusion region FDe is similar to the structure of each of the four regions FD1, FD2, FD3, and FD4, the charge loss in the second mode may be via interface borders with a single extra floating diffusion region FDe and thus may be approximately four times smaller than the combined loss caused by the first to fourth floating diffusion regions FD1 to FD4. In this regard, the second mode may have an advantage over the first mode. In another regard, the extra floating diffusion region FDe can be intentionally disposed to be sufficiently separated from the active regions ACT1 to ACT4 so that the dark current generated at the interfaces between the active regions ACT1 to ACT4 and a substrate can be reduced in the signal chain when operated under the second mode. The combination of the reduced charge loss and the lower dark current in the second mode under this design can render the second mode in image capturing operation under the low illumination conditions a more precise image capturing operation than the image capturing operation under the first mode. When the image capturing operation is performed for a scene under well-illuminated conditions, the effects of the charge loss during the charge transfer and the dark current do not significantly impact the image capturing operation performance and thus using the first mode for image capture operation via four different floating diffusion regions FD1, FD2, FD3, and FD4 under this design is a better option by taking advantage of the spatially distributed collection of the photo-generated charges at different locations in a larger effective photo receiving area in the first mode.

Figure 3A:
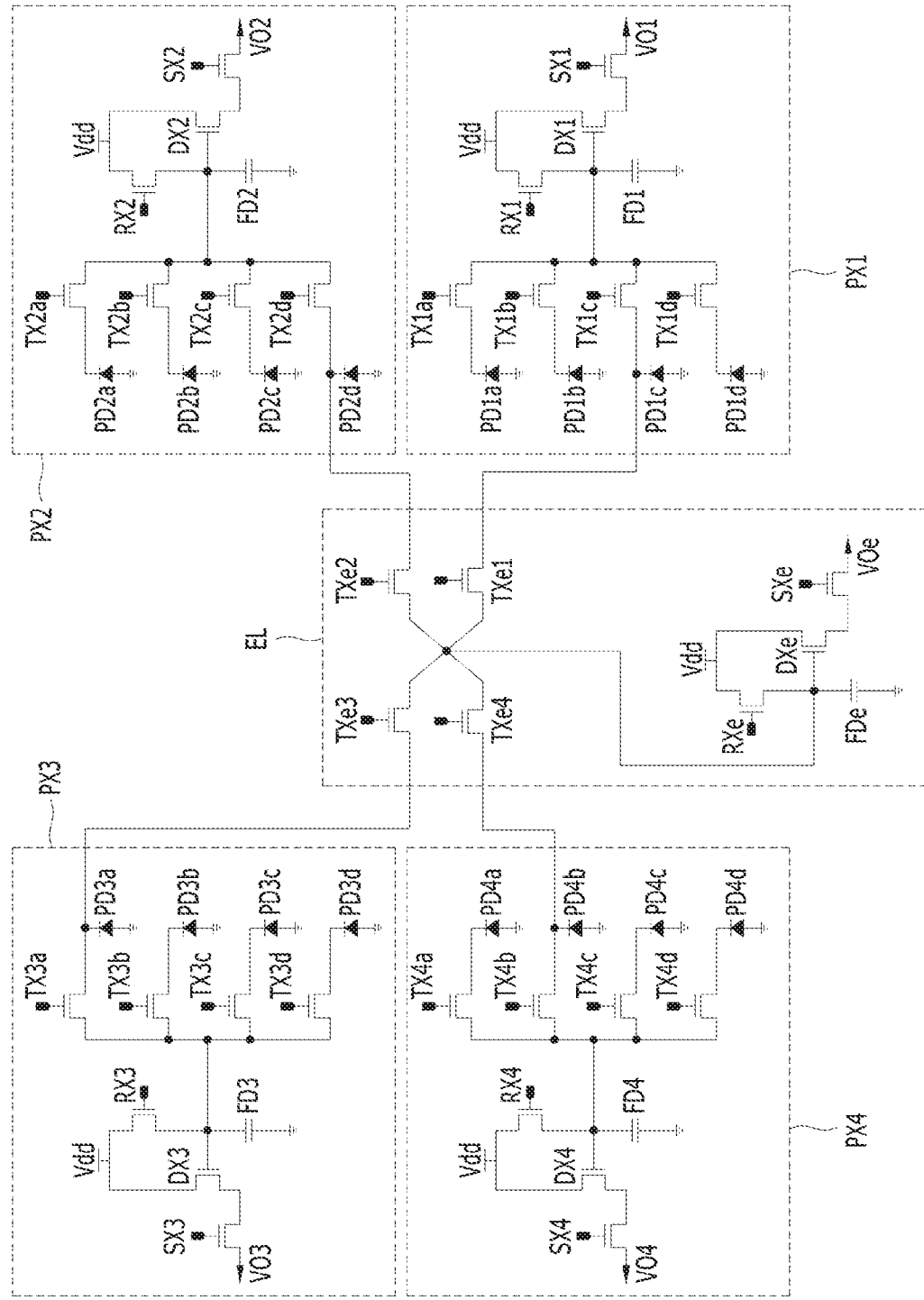
FIGS. 3A to 3C are schematic equivalent circuit diagrams of the pixel block of FIG. 2.
Figure 3B:
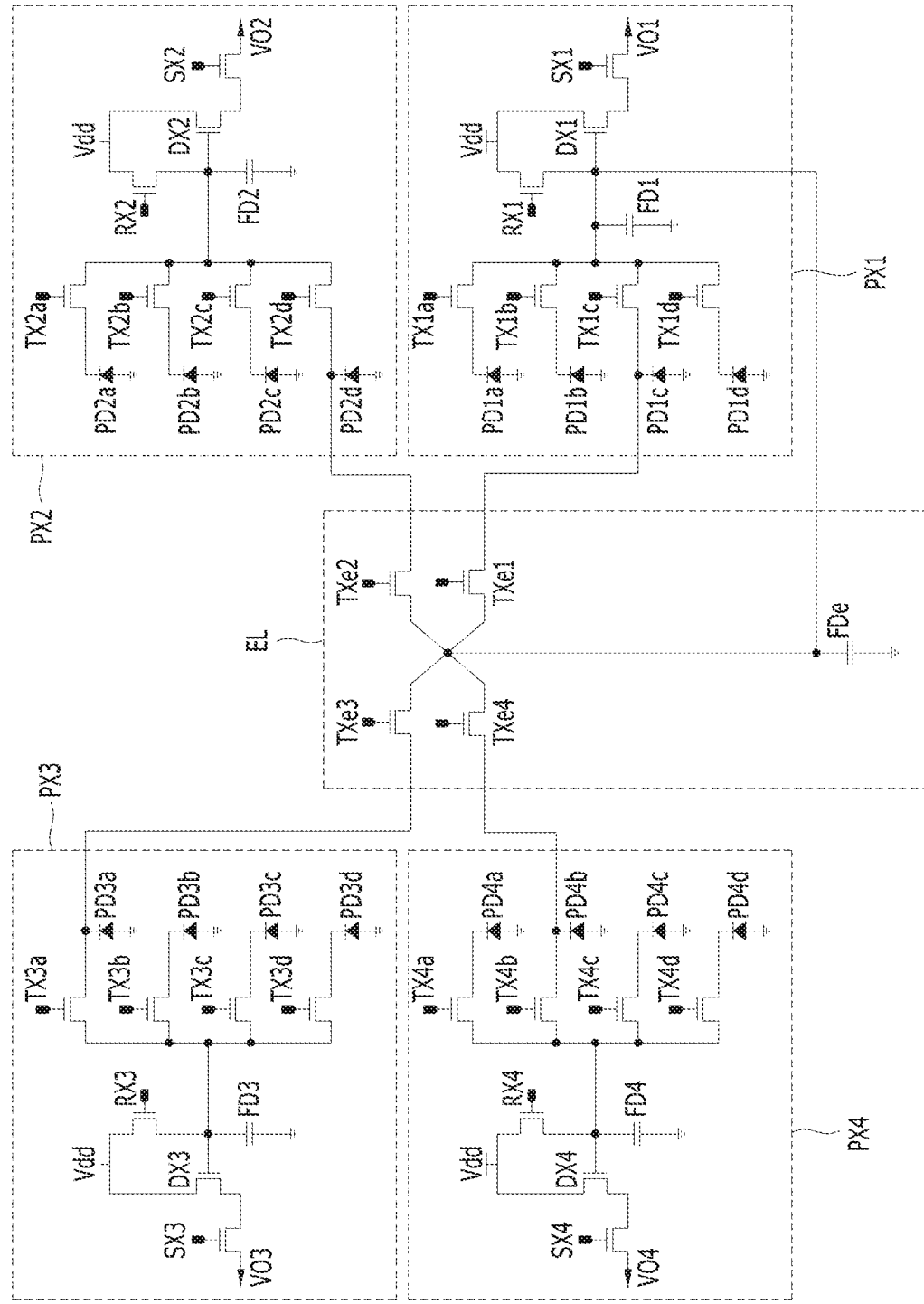
Figure 3C:
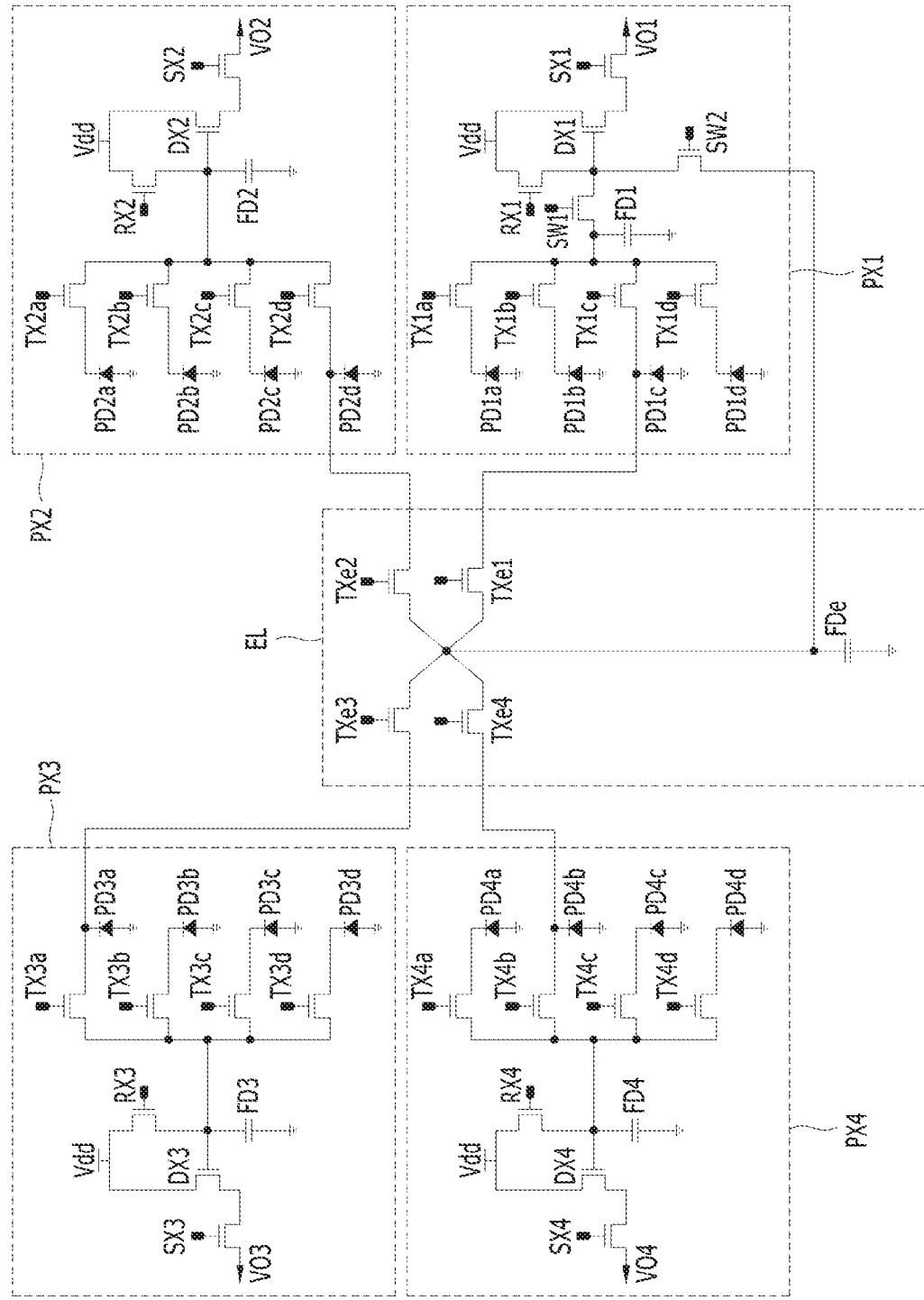

FIGS. 3A to 3C are schematic equivalent circuit diagrams of the pixel block 815A of FIG. 2. Referring to FIG. 3A, the pixel block 815A in accordance with the embodiment of the disclosed technology may include first to fourth unit pixels PX1 to PX4 and an extra element EL. The first to fourth unit pixels PX1 to PX4 may include first to fourth photodiodes PD1a to PD1d, PD2a to PD2d, PD3a to PD3d, and PD4a to PD4d, first to fourth transfer transistors (gates) TX1a to TX1d, TX2a to TX2d, TX3a to TX3d, and TX4a to TX4d, first to fourth floating diffusion regions FD1 to FD4, first to fourth reset transistors RX1 to RX4, first to fourth drive transistors DX1 to DX4, and first to fourth selection transistors SX1 to SX4, respectively. The extra element EL may include first to fourth extra transfer transistors TXe1 to TXe4, an extra floating diffusion region FDe, an extra reset transistor RXe, an extra drive transistor DXe, and an extra selection transistor SXe.

The first to fourth photodiodes PD1a to PD1d, PD2a to PD2d, PD3a to PD3d, and PD4a to PD4d of the first to fourth unit pixels PX1 to PX4 may receive light and generate photo-charges. The photo-charges generated by the first to fourth photodiodes PD1a to PD1d, PD2a to PD2d, PD3a to PD3d, and PD4a to PD4d may be transmitted to the first to fourth floating diffusion regions FD1 to FD4 through the first to fourth transfer transistors TX1a to TX1d, TX2a to TX2d, TX3a to TX3d, and TX4a to TX4d of the first to fourth unit pixels PX1 to PX4. The photo-charges may be stored in the first to fourth floating diffusion regions FD1 to FD4 and then provided to the gate electrodes of the first to fourth drive transistors DX1 to DX4. Based on the amount of the photo-charges provided, the first to fourth drive transistors DX1 to DX4 may output a power supply voltage Vdd to the first to fourth selection transistors SX1 to SX4. The first to fourth selection transistors SX1 to SX4 may output the voltages outputted from the first to fourth drive transistors DX1 to DX4, to first to fourth output ports VO1 to VO4, respectively. The first to fourth reset transistors RX1 to RX4 may reset the first to fourth floating diffusion regions FD1 to FD4, respectively, to the level of the power supply voltage Vdd.

The extra transfer transistors TXe1 to TXe4 are electrically connected to corresponding photodiodes of the first to fourth unit pixel PX1 to PX4 and thus transfer the photo-charges generated in the first to fourth unit pixel PX1 to PX4 to the extra floating diffusion region FDe. The first extra transfer transistor TXe1 may electrically couple the first photodiode PD1c of the first unit pixel PX1 and the extra floating diffusion region FDe. Thus, the first extra transfer transistor TXe1 may transfer the photo-charges generated in the first photodiode PD1c of the first unit pixel PX1 to the extra floating diffusion region FDe.

The second extra transfer transistor TXe2 may electrically couple the second photodiode PD2d of the second unit pixel PX2 and the extra floating diffusion region FDe. Thus, the second extra transfer transistor TXe2 may transfer the photo-charges generated in the second photodiode PD2d of the second unit pixel PX2 to the extra floating diffusion region FDe.

The third extra transfer transistor TXe3 may electrically couple the third photodiode PD3a of the third unit pixel PX3 and the extra floating diffusion region FDe. Thus, the third extra transfer transistor TXe3 may transfer the photo-charges generated in the third photodiode PD3a of the third unit pixel PX3 to the extra floating diffusion region FDe.

The fourth extra transfer transistor TXe4 may electrically couple the fourth photodiode PD4b of the fourth unit pixel PX4 and the extra floating diffusion region FDe. Thus, the fourth extra transfer transistor TXe4 may transfer the photo-charges generated in the third photodiode PD4b of the fourth unit pixel PX4 to the extra floating diffusion region FDe.

The photo-charges may be stored in the extra floating diffusion region FDe and provided to the gate electrode of the extra drive transistor DXe, and the extra drive transistor DXe may output the power supply voltage Vdd to the extra selection transistor SXe based on the amount of the photo-charges. The extra selection transistor SXe may output the voltage outputted from the extra drive transistor DXe, to an extra output port VOe. The extra reset transistor RXe may reset the extra floating diffusion region FDe to an initial voltage state, for example, the level of the power supply voltage Vdd.

In a first mode, for example, a high illumination mode in which an amount of received light is sufficient, the first to fourth unit pixels PX1 to PX4 may be activated. In a second mode, for example, a low illumination mode in which an amount of received light is small, the extra element EL may be activated.

Whether to select the first mode and the second mode may be determined depending on the determination of a microprocessor or a mode controller. For example, whether the image sensor 800 will operate in the first mode or the second mode may be determined depending on an amount of light received in the image sensor 800 before capturing an image.

In the high illumination mode, the first to fourth transfer transistors TX1a to TX1d, TX2a to TX2d, TX3a to TX3d and TX4a to TX4d of the first to fourth unit pixels PX1 to PX4 may be activated, and the first to fourth extra transfer transistors TXe1 to TXe4 of the extra element EL may be deactivated. In the high illumination mode, a negative voltage may be applied to the gate electrodes of the first to fourth extra transfer transistors TXe1 to TXe4 of the extra element EL. In the low illumination mode, the first to fourth transfer transistors TX1a to TX1d, TX2a to TX2d, TX3a to TX3d and TX4a to TX4d of the first to fourth unit pixels PX1 to PX4 may be deactivated, and the first to fourth extra transfer transistors TXe1 to TXe4 of the extra element EL may be activated. In the low illumination mode, a negative voltage may be applied to the gate electrodes of the first to fourth transfer transistors TX1a to TX1d, TX2a to TX2d, TX3a to TX3d and TX4a to TX4d of the first to fourth unit pixels PX1 to PX4.

Referring to FIG. 3B, the pixel block 815A in accordance with the embodiment of the disclosed technology may include first to fourth unit pixels PX1 to PX4 and an extra element EL. The first to fourth unit pixels PX1 to PX4 may include first to fourth photodiodes PD1a to PD1d, PD2a to PD2d, PD3a to PD3d and PD4a to PD4d, first to fourth transfer transistors TX1a to TX1d, TX2a to TX2d, TX3a to TX3d and TX4a to TX4d, first to fourth floating diffusion regions FD1 to FD4, first to fourth reset transistors RX1 to RX4, first to fourth drive transistors DX1 to DX4 and first to fourth selection transistors SX1 to SX4, respectively. The extra element EL may include first to fourth extra transfer transistors TXe1 to TXe4 and an extra floating diffusion region FDe.

The first output circuit of the first unit pixel PX1 may include the first reset transistor RX1, the first drive transistor DX1 and the first selection transistor SX1, the second output circuit of the second unit pixel PX2 may include the second reset transistor RX2, the second drive transistor DX2 and the second selection transistor SX2, the third output circuit of the third unit pixel PX3 may include the third reset transistor RX3, the third drive transistor DX3 and the third selection transistor SX3, and the fourth output circuit of the fourth unit pixel PX4 may include the fourth reset transistor RX4, the fourth drive transistor DX4 and the fourth selection transistor SX4.

When compared to the pixel block 815A of FIG. 3A, the first to fourth extra transfer transistors TXe1 to TXe4 and the extra floating diffusion region FDe of the extra element EL may share the output circuit of one of the first to fourth unit pixels PX1 to PX4. In FIG. 3B, it is illustrated as an example that the extra element EL shares the output circuit of the first unit pixel PX1. Thus, one terminal of the extra floating diffusion region FDe of the extra elements EL is connected to a node connected to one terminal of the first reset transistor RX1, one terminal of the first drive transistor DX1, and one terminal of the first floating diffusion region FD1. In other embodiments, the extra element EL can share one of the output circuits of the second to fourth unit pixels PX2 to PX4 instead of the first unit pixel PX1.

In the high illumination mode, a negative voltage may be applied to the gate electrodes of the first to fourth extra transfer transistors TXe1 to TXe4 of the extra element EL. In the low illumination mode, a negative voltage may be applied to the gate electrodes of the first to fourth transfer transistors TX1a to TX1d, TX2a to TX2d, TX3a to TX3d and TX4a to TX4d of the first to fourth unit pixels PX1 to PX4.

Referring to FIG. 3C, the pixel block 815A in accordance with the embodiment of the disclosed technology may include first to fourth unit pixels PX1 to PX4 and an extra element EL. When compared to the pixel block 815A shown in FIG. 3B, the output circuit shared by the extra element EL among first to fourth output circuits may further include first and second mode selection switching elements SW1 and SW2.

For example, in the high illumination mode, the first mode selection switching element SW1 may be turned on, and the second mode selection switching element SW2 may be turned off. Therefore, in the high illumination mode, first transfer transistors TX1a to TX1d of the first unit pixel PX1 may be activated, and first to fourth extra transfer transistors TXe1 to TXe4 of the extra element EL may be deactivated. In the low illumination mode, the first mode selection switching element SW1 may be turned off, and the second mode selection switching element SW2 may be turned on. Therefore, in the low illumination mode, the first transfer transistors TX1a to TX1d of the first unit pixel PX1 may be deactivated, and the first to fourth extra transfer transistors TXe1 to TXe4 of the extra element EL may be activated.

In the high illumination mode, a negative voltage may be applied to the gate electrodes of the first to fourth extra transfer transistors TXe1 to TXe4 of the extra elements EL. In the low illumination mode, a negative voltage may be applied to the gate electrodes of first to fourth transfer transistors TX1a to TX1d, TX2a to TX2d, TX3a to TX3d, and TX4a to TX4d of the first to fourth unit pixels PX1 to PX4.

Figure 4A:
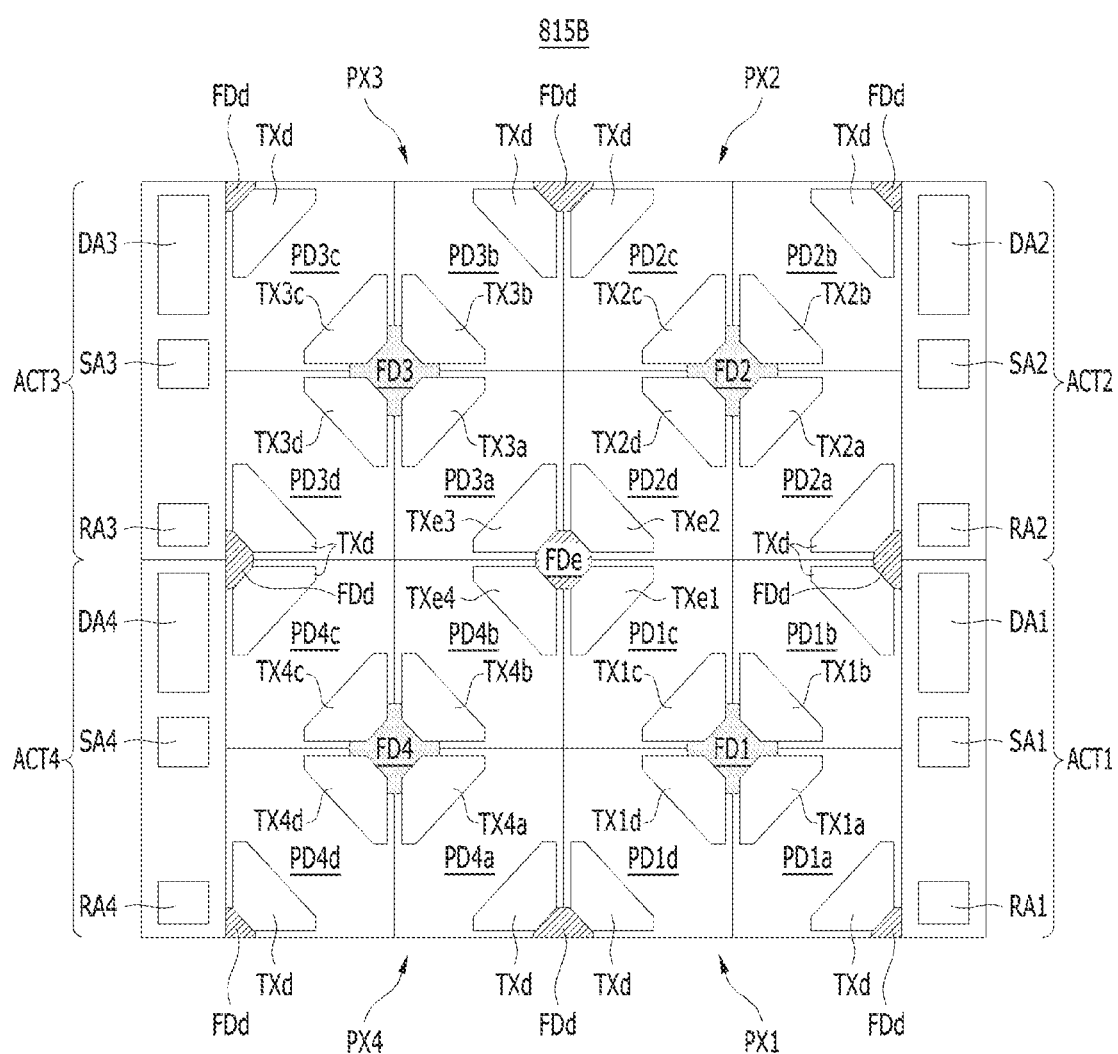
FIGS. 4A and 4B are schematic layout diagrams illustrating representations of examples of pixel blocks in accordance with embodiments of the disclosed technology.
Figure 4B:
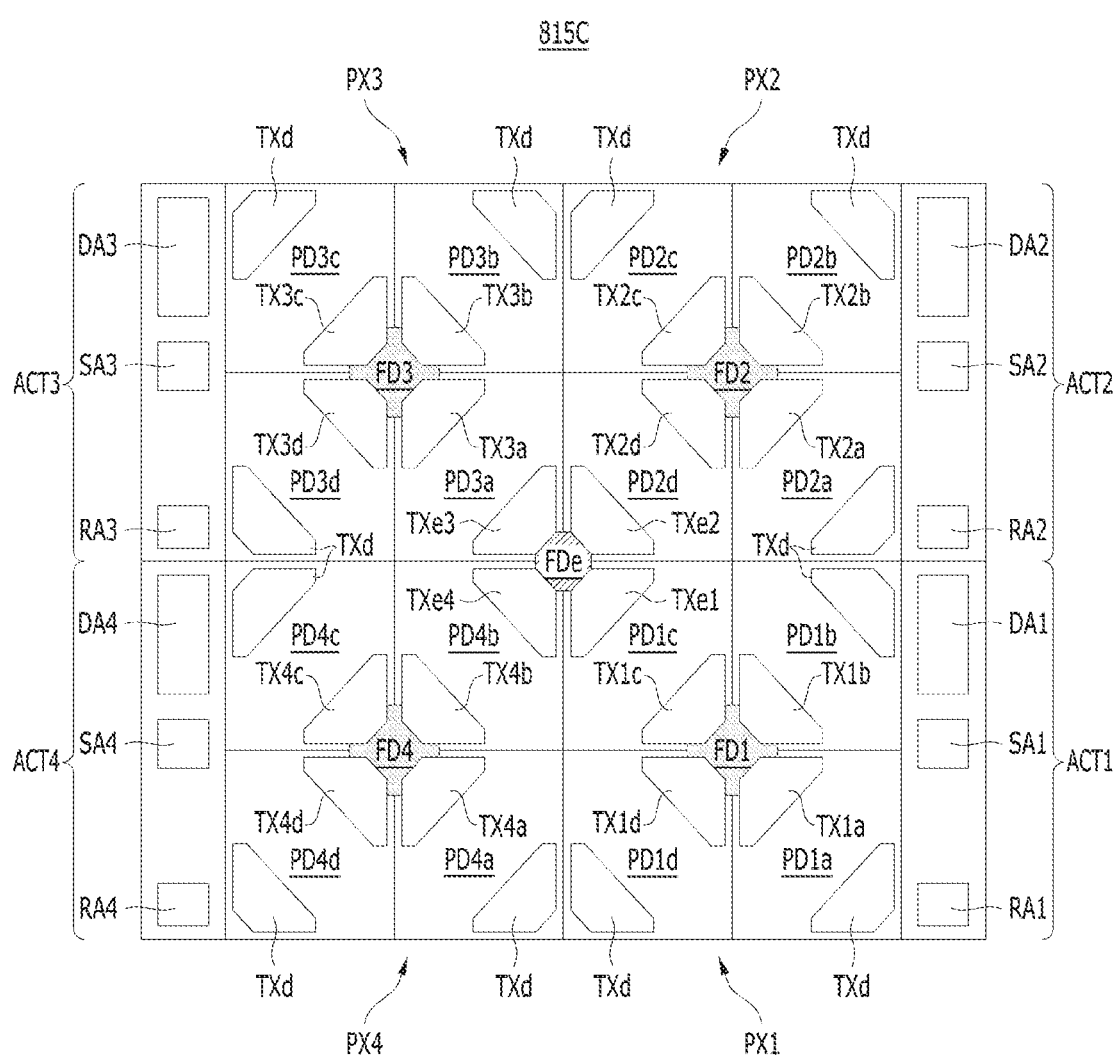

FIGS. 4A and 4B are schematic layout diagrams illustrating representations of examples of pixel blocks 815B and 815C in accordance with embodiments of the disclosed technology. Referring to FIG. 4A, when compared to the pixel block 815A of FIG. 2, the pixel block 815B in accordance with the embodiment of the disclosed technology may further include a plurality of dummy transfer gates TXd and a plurality of dummy floating diffusion regions FDd. The dummy transfer gates TXd and the plurality of dummy floating diffusion regions FDd are designed and operated to improve overall fabrication. Such circuit structures are "dummy" in the context that they are not used or connected to directly provide any specific circuitry function for the imaging operation. In the examples provided below, the dummy transfer gates TXd and the dummy floating diffusion regions FDs are designed to mitigate non-uniformity occurred in the structure of the pixel array and associated circuitry during the fabrication process of the image sensor. The dummy transfer gates TXd and the dummy floating diffusion regions FDd may be disposed at the corners of the first to fourth unit pixels PX1 to PX4.

For example, some of the dummy transfer gates TXd and the dummy floating diffusion regions FDd may be disposed at or around the three corners of the first unit pixel PX1 except one corner of the first unit pixel PX1 at or around where the first extra transfer gate TXe1 is disposed. Some of some of the dummy transfer gates TXd and the dummy floating diffusion regions FDd may be disposed at or around the three corners of the second unit pixel PX2 except one corner of the second unit pixel PX2 at or around where the second extra transfer gate TXe2 is disposed. Some of some of the dummy transfer gates TXd and the dummy floating diffusion regions FDd may be disposed at or around the three corners of the third unit pixel PX3 except one corner of the third unit pixel PX3 at or around where the third extra transfer gate TXe3 is disposed. Some of some of the dummy transfer gates TXd and the dummy floating diffusion regions FDd may be disposed at or around the three corners of the fourth unit pixel PX4 except one corner of the fourth unit pixel PX4 at or around where the fourth extra transfer gate TXe4 is disposed. Each of the photodiodes PD1a to PD1d, PD2a to PD2d, PD3a to PD3d and PD4a to PD4d may overlap with one of the real transfer gates TX1a to TX1d, TX2a to TXd, TX3a to TX3d, TX4a to TX4d, and TXe1 to TXe4 and one of the dummy transfer gates TXd.

The dummy transfer gates TXd and the dummy floating diffusion regions FDd may assist in reducing or solving non-uniformity in the device structure occurred due to differences in pattern density in the process of forming an image sensor 800 in accordance with the embodiment of the disclosed technology. For example, in the case where a pattern density is not uniform, non-uniformity in terms of the sizes, depths, widths, concentrations and other specifications of respective patterns may become to increase in a manufacturing process. Thus, by making a pattern density uniform, it is possible to reduce or solve non-uniformity in terms of the sizes, depths, widths, concentrations and other specifications of completed patterns, which occurred in the fabrication process of the image sensor. The dummy transfer gates TXd and the dummy floating diffusion regions FDd are included in a similar pattern as the photodiodes PD1a to PD1d, PD2a to PD2d, PD3a to PD3d, and PD4a to PD4d. and floating diffusion regions FD1 to FD4 of the first to fourth unit pixels PX1 to PX4 and the extra first to fourth extra transfer gates TXe1 to TXe4 and the extra floating diffusion regions FDe, thereby reducing differences in pattern density in the image sensor.

Referring to FIG. 4B, when compared to the pixel block 815B of FIG. 4A, the pixel block 815C in accordance with the embodiment of the disclosed technology may include the dummy transfer gates TXd only without including the plurality of dummy floating diffusion regions FDd. That is to say, the pixel block 815C in accordance with the embodiment of the disclosed technology may further include only the plurality of dummy transfer gates TXd. Since the influence of the first to fourth floating diffusion regions FD1 to FD4 exerted on the non-uniformity during the manufacturing process is relatively small as compared to that of the dummy transfer gates TXd, the dummy floating diffusion regions FDd of FIG. 4A can be omitted.

Figure 5:
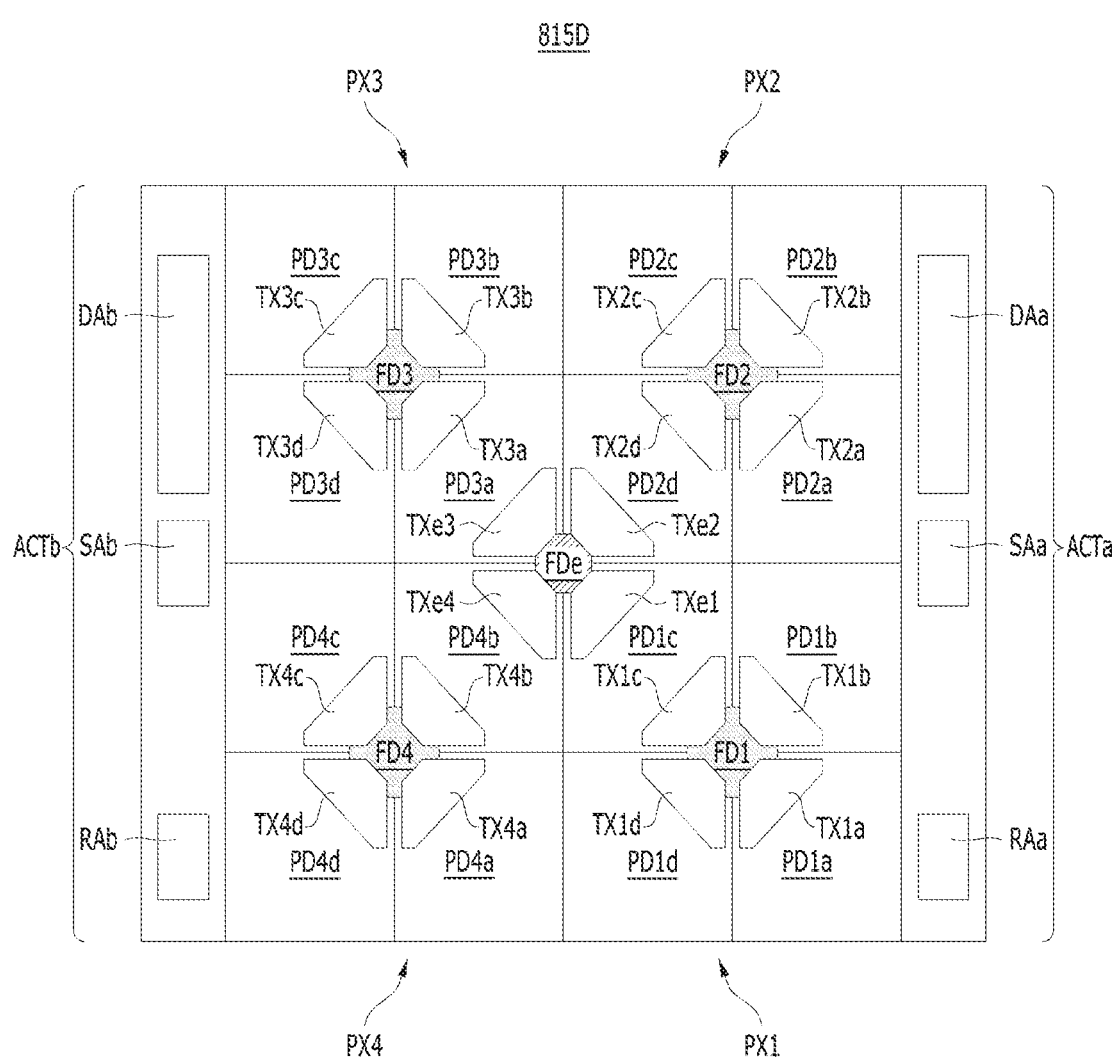
FIG. 5 is a schematic layout diagram illustrating a representation of an example of the pixel block of an image sensor in accordance with an embodiment of the disclosed technology.

FIG. 5 is a schematic layout diagram illustrating a representation of an example of a pixel block 815D of a pixel array 810 of an image sensor 800 in accordance with an embodiment of the disclosed technology. Referring to FIG. 5, the pixel block 815D of the pixel array 810 of the image sensor 800 in accordance with the embodiment of the disclosed technology may include a first unit pixel PX1 which is arranged in a first quadrant, a second unit pixel PX2 which is arranged in a second quadrant, a third unit pixel PX3 which is arranged in a third quadrant, a fourth unit pixel PX4 which is arranged in a fourth quadrant, extra elements TXe1 to TXe4 and FDe which are disposed at a center of the pixel block 815D, a first active region ACTa which is disposed on the outer surfaces or sides of the first unit pixel PX1 and the second unit pixel PX2, and a second active region ACTb which is disposed on the outer surfaces or sides of the third unit pixel PX3 and the fourth unit pixel PX4. The first active region ACTa is disposed on sides of the first unit pixel PX1 and the second unit pixel PX2, and the second active region ACTb are disposed on sides of the third unit pixel PX3 and the fourth unit pixel PX4.

The first active region ACTa may be shared by the first unit pixel PX1 and the second unit pixel PX2, and the second active region ACTb may be shared by the third unit pixel PX3 and the fourth unit pixel PX4. For example, a first floating diffusion region FD1 and a second floating diffusion region FD2 may be coupled with the first active region ACTa, and a third floating diffusion region FD3 and a fourth floating diffusion region FD4 may be coupled with the second active region ACTb. In other words, the pixel block 815D may have 16 photodiodes PD1a to PD1d, PD2a to PD2d, PD3a to PD3d and PD4a to PD4d. Among them, eight photodiodes, that is, first photodiodes PD1a to PD1d of the first unit pixel PX1 and second photodiodes PD2a to PD2d of the second unit pixel PX2, may share the one first active region ACTa, and the other eight photodiodes, that is, third photodiodes PD3a to PD3d of the third unit pixel PX3 and fourth photodiodes PD4a to PD4d of the fourth unit pixel PX4, may share the one second active region ACTb. Descriptions for components which are not described herein may be understood when referring to FIG. 2.

Each of the first and second active region ACTa and ACTb includes one of first and second reset active regions RAa and RAb, one of first and second drive active regions DAa and DAb, and one of first and second selection active regions SAa and SAb. The first and second reset active regions RAa and RAb, the first and second drive active regions DAa and DAb, and the first and second selection active regions SAa and SAb of the first and second active regions ACTa and ACTb may have larger area than the first to fourth drive active regions DA1 to DA4 and the first to fourth selection active regions SA1 to SA4 of FIG. 2. Thus, the size of the reset active region, the drive active region, and the selective active region, which are included in each active region ACTa and ACTb as shown in FIG. 5, for the first to fourth photodiodes PD1a to PD1d, PD2a to PD2d, PD3a to PD3d and PD4a to PD4d is greater than the size of reset active region, the drive active region, and the selective active region, which are included in each active region ACT1 to ACT4 as shown in FIG. 2, for the first to fourth photodiodes PD1a to PD1d, PD2a to PD2d, PD3a to PD3d and PD4a to PD4d. Therefore, when assuming that the pixel blocks 815A and 815D have the same size to each other, the first and second reset active regions RAa and RAb, the first and second drive active regions DAa and Dab, and the first and second selection active regions SAa and SAb of FIG. 5 may have higher operational capabilities than the first to fourth reset active regions RA1 to RA4, the first to fourth drive active regions DA1 to DA4 and the first to fourth selection active regions SA1 to SA4 of FIG. 2.

In the case where the first and second reset active regions RAa and RAb, the first and second drive active regions DAa and DAb and the first and second selection active regions SAa and SAb of FIG. 5 and the first to fourth reset active regions RA1 to RA4, the first to fourth drive active regions DA1 to DA4 and the first to fourth selection active regions SA1 to SA4 of FIG. 2 have the same size, the first to fourth photodiodes PD1a to PD1d, PD2a to PD2d, PD3a to PD3d and PD4a to PD4d of FIG. 5 may be formed to have a smaller size than the first to fourth photodiodes PD1a to PD1d, PD2a to PD2d, PD3a to PD3d and PD4a to PD4d of FIG. 2. Thus, the image sensor 800 in accordance with the embodiment of the disclosed technology may be designed to have a high degree of integration and achieve a high resolution and a low power consumption.

Figure 6A:
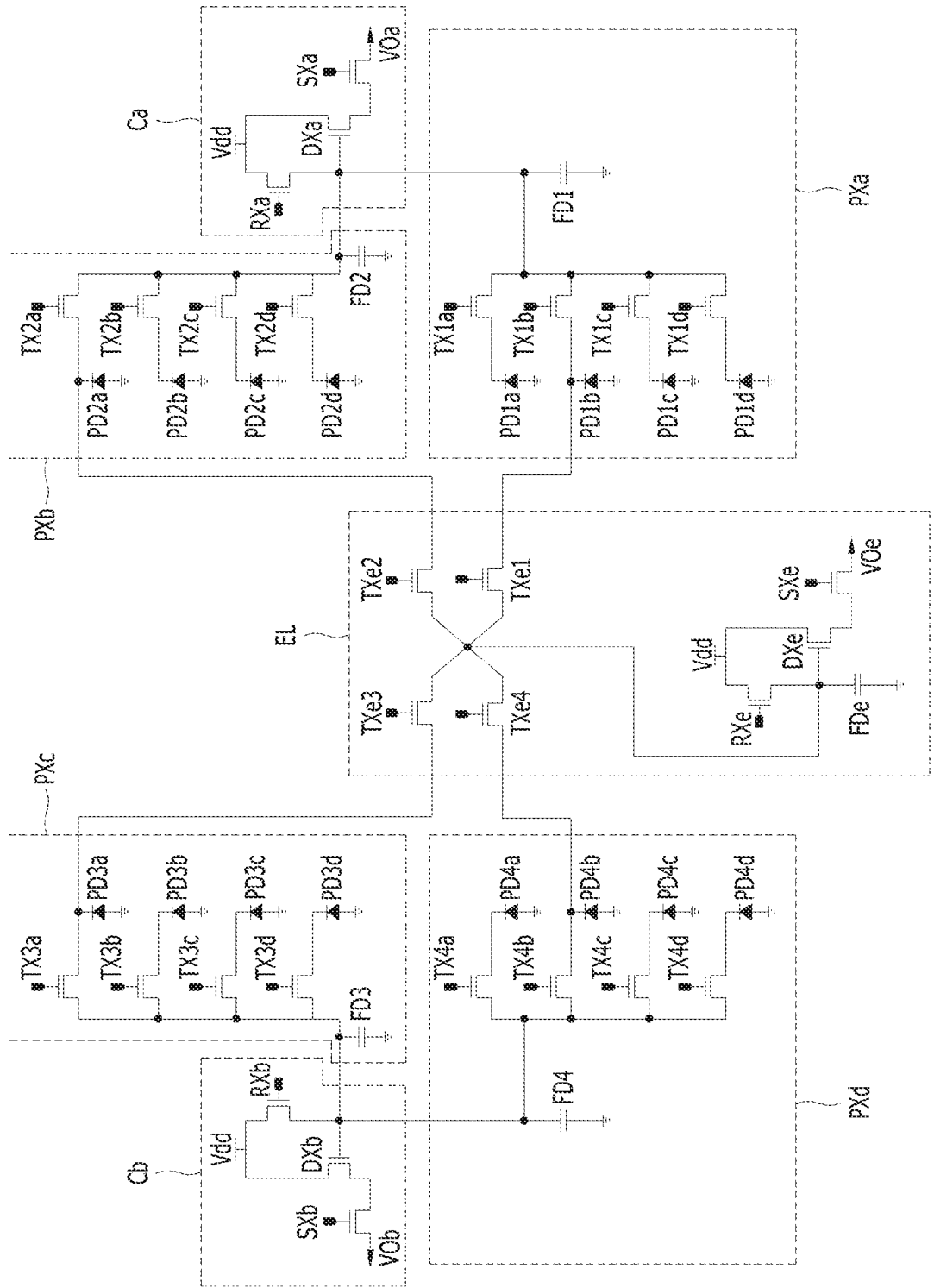
FIGS. 6A to 6C are schematic equivalent circuit diagrams of the pixel block of FIG. 5.
Figure 6B:
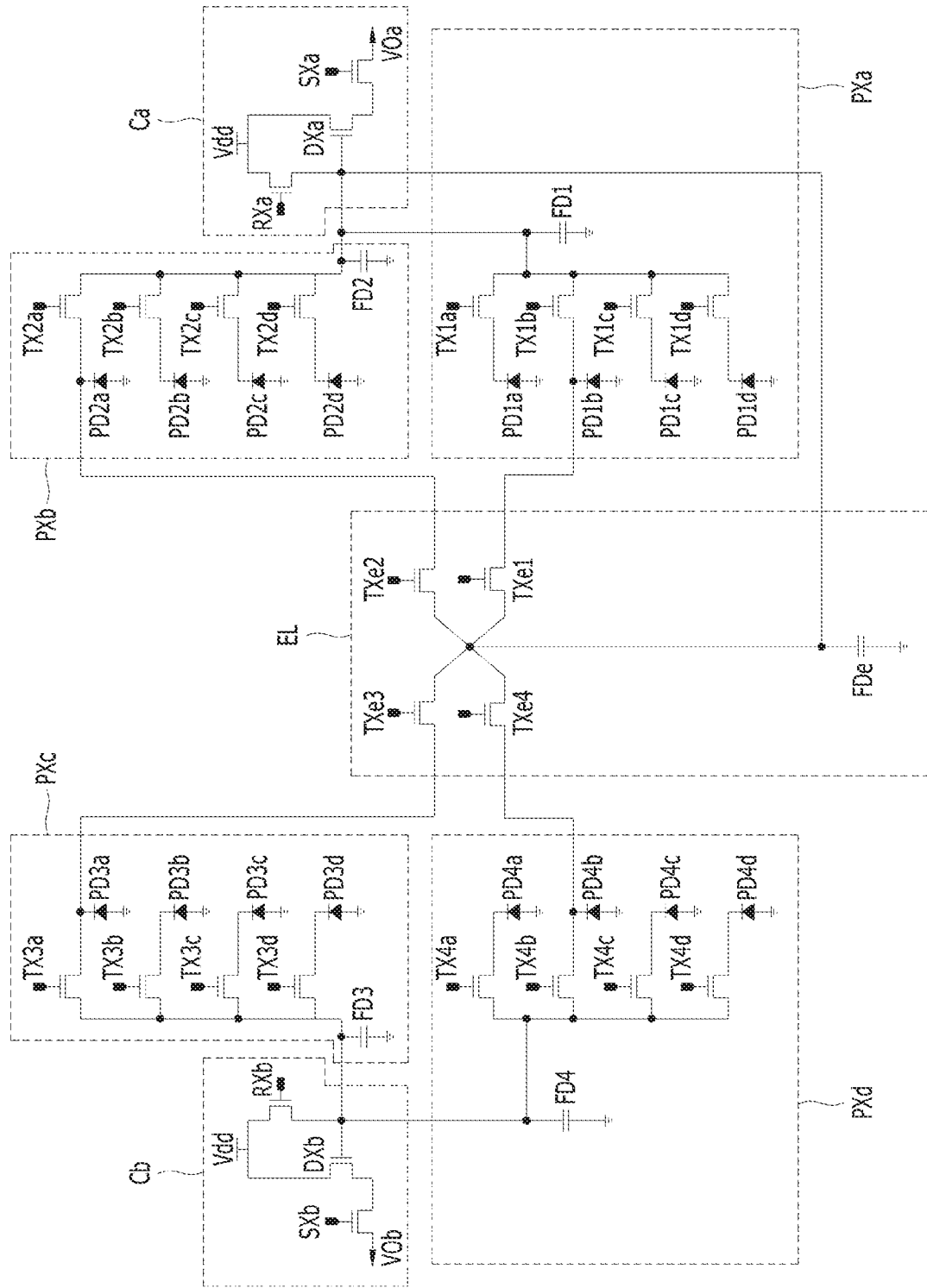
Figure 6C:
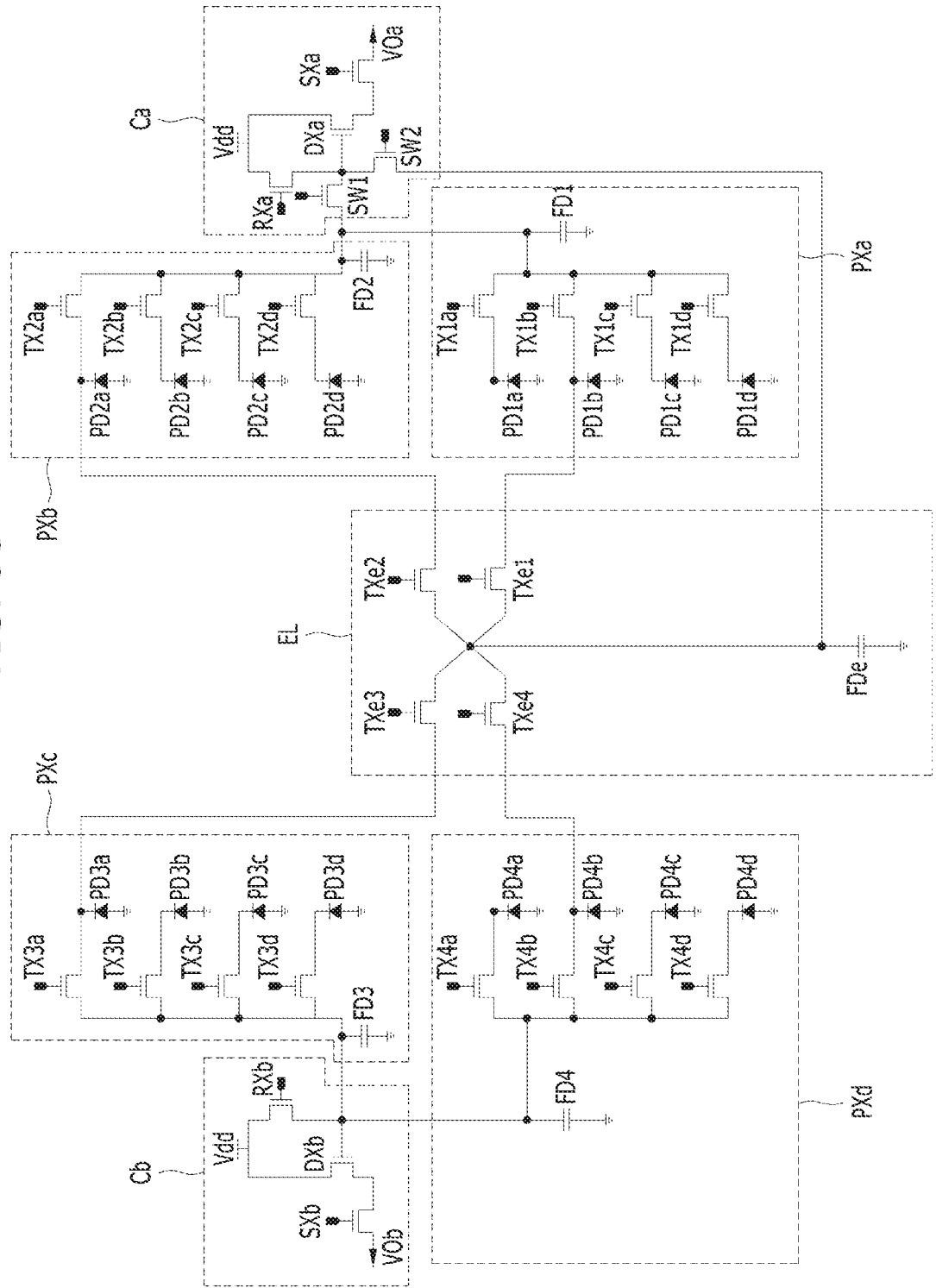

FIGS. 6A to 6C are schematic equivalent circuit diagrams of the pixel block 815D of FIG. 5. Referring to FIG. 6A, the pixel block 815D in accordance with the embodiment of the disclosed technology may include a first output circuit Ca which is electrically coupled with the first unit pixel PX1 and the second unit pixel PX2, and a second output circuit Cb which is electrically coupled with the third unit pixel PX3 and the fourth unit pixel PX4. An extra element EL may have a separate output circuit.

Referring to FIG. 6B, the pixel block 815D in accordance with the embodiment of the disclosed technology may include a first output circuit Ca which is electrically coupled with the first unit pixel PX1 and the second unit pixel PX2, and a second output circuit Cb which is electrically coupled with the third unit pixel PX3 and the fourth unit pixel PX4. An extra element EL may be electrically coupled with one of the first and second output circuits Ca and Cb. Thus, the extra element EL may not have a separate output circuit and may share one of the first and second output circuits Ca and Cb. For instance, it is illustrated that the extra element EL is electrically coupled with the first output circuit Ca. In another embodiment, the extra element EL may be electrically coupled with the second output circuit Cb.

Referring to FIG. 6C, the pixel block 815D in accordance with the embodiment of the disclosed technology may include a first output circuit Ca which is electrically coupled with the first unit pixel PX1 and the second unit pixel PX2, and a second output circuit Cb which is electrically coupled with the third unit pixel PX3 and the fourth unit pixel PX4. An extra element EL may be electrically coupled with one of the first and second output circuits Ca and Cb. Thus, the extra element EL may not have a separate output circuit and may share one of the first and second output circuits Ca and Cb. For instance, it is illustrated that the extra element EL is electrically coupled with the first output circuit Ca.

The first output circuit Ca which is electrically coupled with the extra element EL may include a first mode selection switching element SW1 which is electrically coupled with the first and second floating diffusion regions FD1 and FD2 and a second mode selection switching element SW2 which is electrically coupled with an extra floating diffusion region FDe. The first mode selection switching element SW1 may be turned on in a first mode and electrically couple the first and second floating diffusion regions FD1 and FD2 and the first output circuit Ca, and the second mode selection switching element SW2 may be turned on in a second mode and electrically couple the extra floating diffusion region FDe and the first output circuit Ca. In another embodiment, the extra element EL may be electrically coupled with the second output circuit Cb. Thus, a first mode selection switching element SW1 and a second mode selection switching element SW2 may be included in the second output circuit Cb.

Figure 7A:
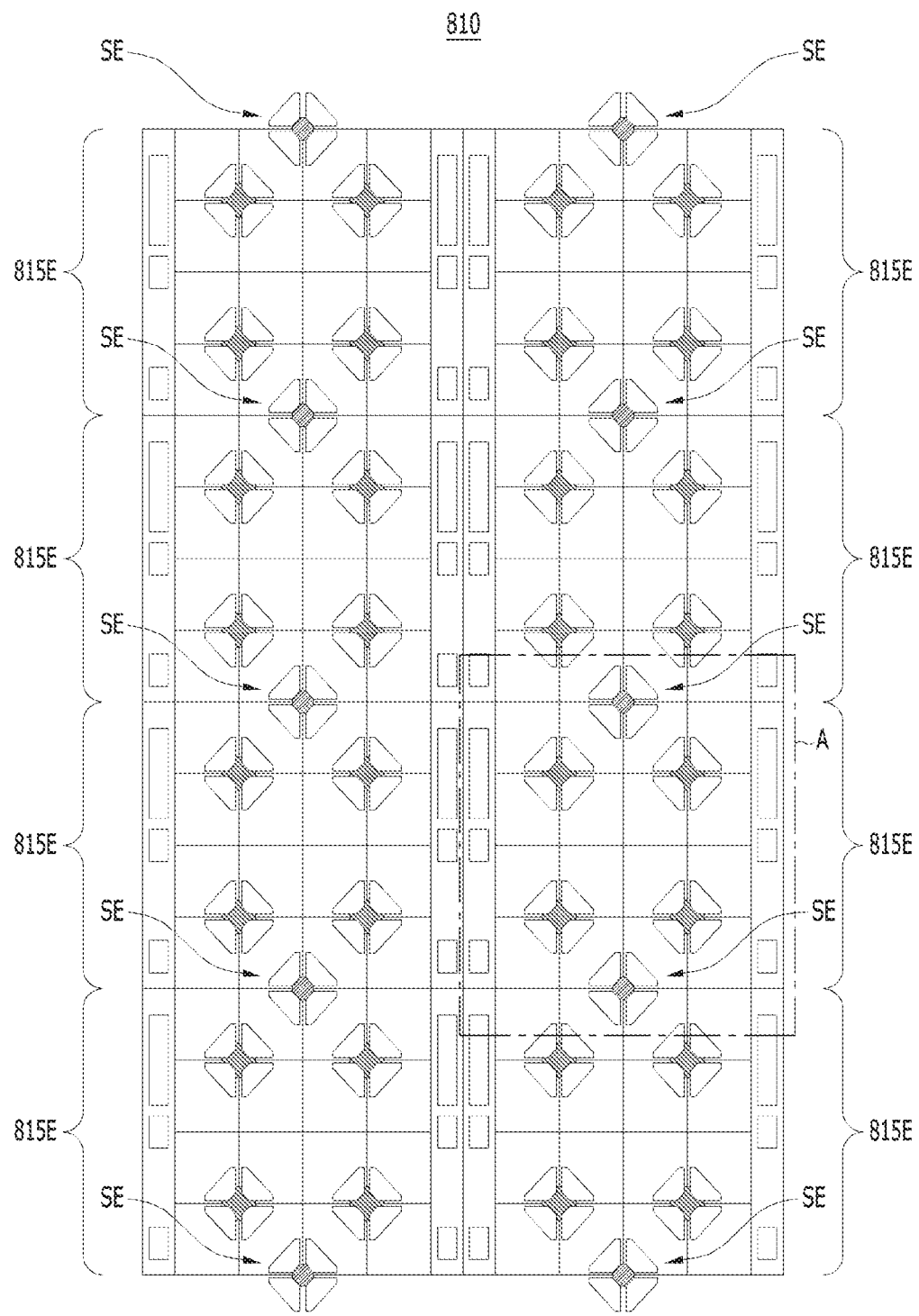
FIG. 7A is a schematic layout diagram illustrating a representation of an example of the pixel array of an image sensor in accordance with an embodiment of the disclosed technology.
Figure 7B:
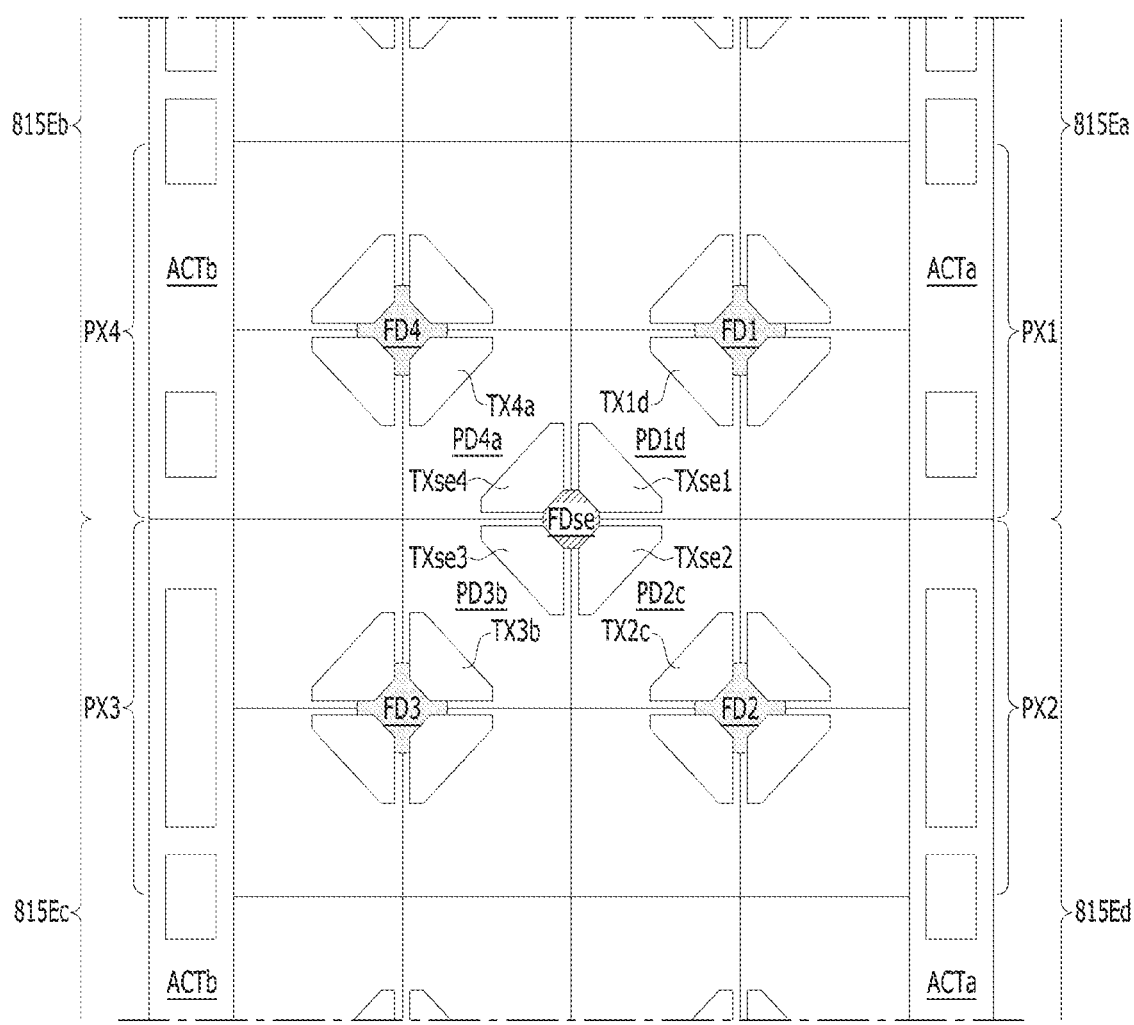
FIG. 7B is an enlarged view of the pixel array.

FIG. 7A is a schematic layout diagram illustrating a representation of an example of a pixel array 810 of an image sensor 800 in accordance with an embodiment of the disclosed technology, and FIG. 7B is an enlarged view of an area A of the pixel array 810. Referring to FIG. 7A, the pixel array 810 of the image sensor 800 in accordance with the embodiment of the disclosed technology may include a plurality of pixel blocks 815E and shared extra elements SE between two adjacent pixel blocks 815E. For example, the shared extra elements SE may be disposed between the pixel blocks 815E which are arranged to be adjacent to each other in a direction. For example, one of the pixel blocks 815E may have an 8-shared pixel structure which shares pixel gates where eight photodiodes are formed in one active region.

Referring to FIG. 7B, the shared extra element SE may be disposed among four pixel blocks 815Ea to 815Ed which are arranged in a matrix form to be adjacent to one another. The shared extra element SE is disposed at the center of the four pixel blocks 815Ea to 815Ed. When additionally referring to FIG. 5, the shared extra element SE may include a first shared extra transfer gate TXse1 which overlaps with a photodiode PD1d disposed at the left bottom of a first unit pixel PX1 of a first pixel block 815Ea, a fourth shared extra transfer gate TXse4 which overlaps with a photodiode PD4a disposed at the right bottom of a fourth unit pixel PX4 of a second pixel block 815Eb, a third shared extra transfer gate TXse3 which overlaps with a photodiode PD3b disposed at the right top of a third unit pixel PX3 of a third pixel block 815Ec, a second shared extra transfer gate TXse2 which overlaps with a photodiode PD2c disposed at the left top of a second unit pixel PX2 of a fourth pixel block 815Ed, and a shared extra floating diffusion region FDse which is disposed at the center of the first to fourth shared extra transfer gates TXse1 to TXse4. The reference characters are included in the drawings to facilitate the understanding of the embodiment of the disclosed technology.

Figure 8A:
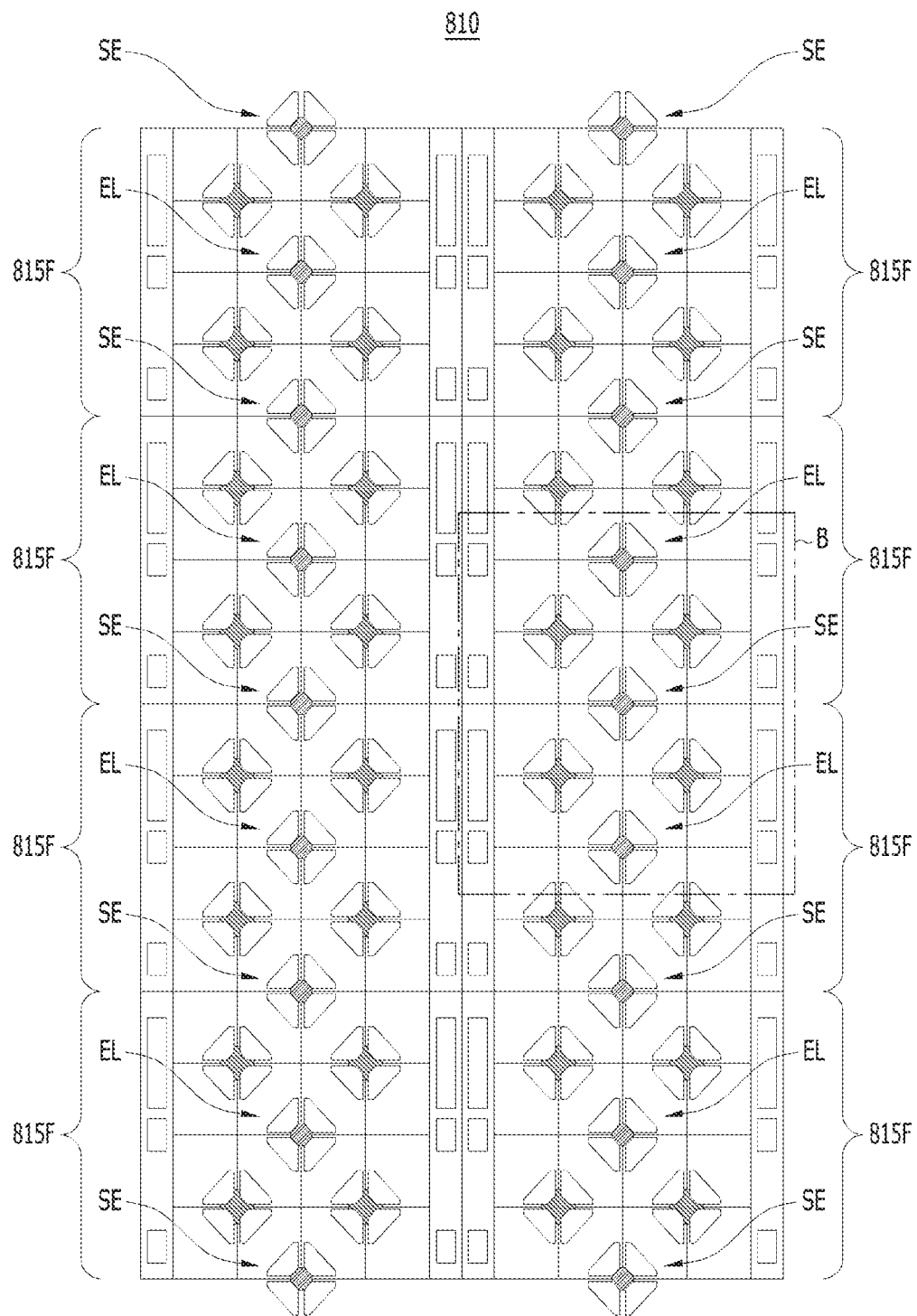
FIG. 8A is a schematic layout diagram illustrating a representation of an example of the pixel array of an image sensor in accordance with an embodiment of the disclosed technology.
Figure 8B:
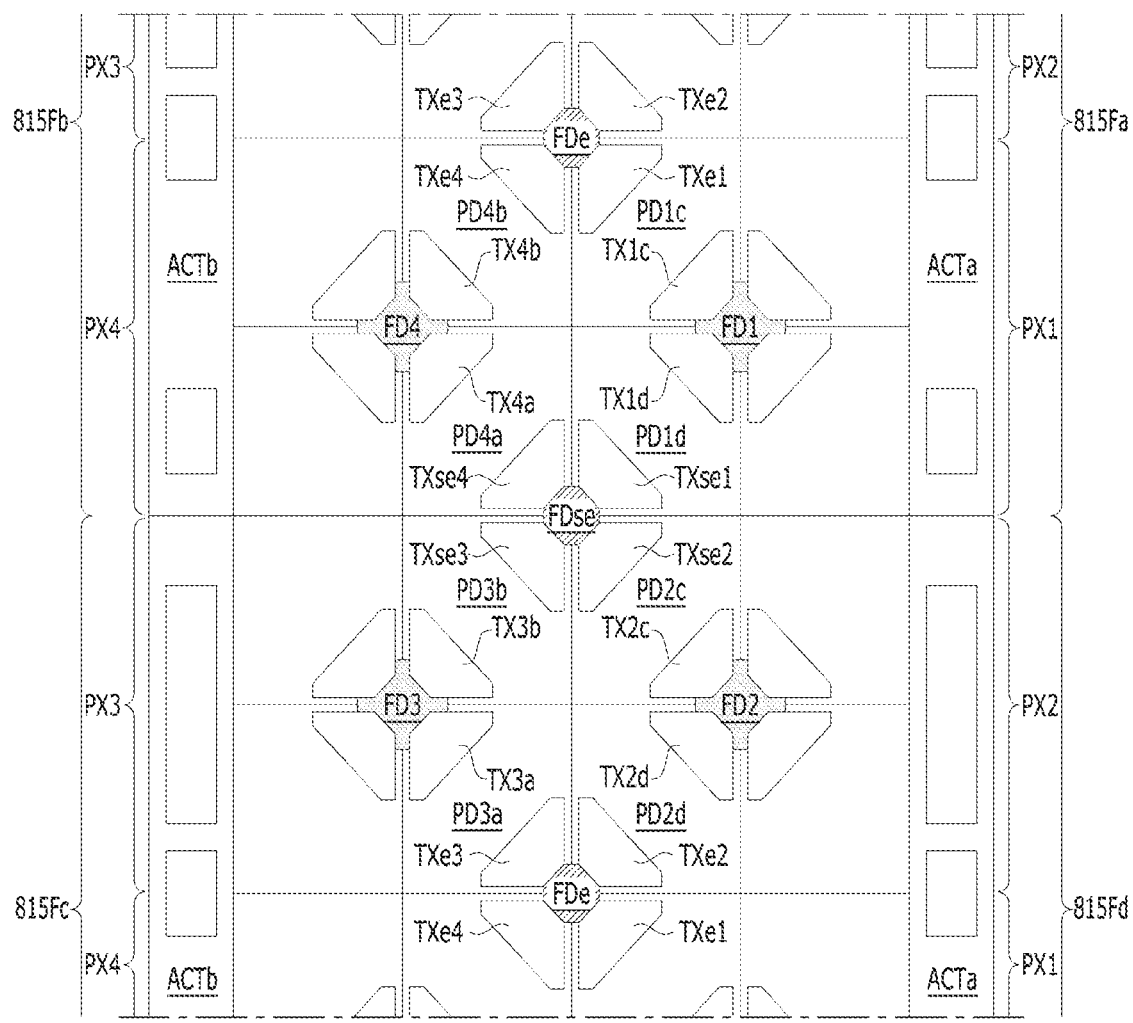
FIG. 8B is an enlarged view of the pixel array.

FIG. 8A is a schematic layout diagram illustrating a representation of an example of a pixel array 810 of an image sensor 800 in accordance with an embodiment of the disclosed technology, and FIG. 8B is an enlarged view of an area B of the pixel array 810. Referring to FIG. 8A, the pixel array 810 of the image sensor 800 in accordance with the embodiment of the disclosed technology may include both the extra elements EL which include the extra elements TXe1 to TXe4 and FDe shown in FIG. 5 and the shared extra elements SE shown in FIGS. 7A and 7B. That is to say, the pixel array 810 may include a plurality of pixel blocks 815F, and the pixel blocks 815F may include the extra elements EL which overlap with portions of the unit pixels PX1 to PX4 and share some photodiodes and the shared extra elements SE which are disposed between the pixel blocks 815F and overlap with portions of the unit pixels PX1 to PX4 of the pixel blocks 815F and share some photodiodes.

Figure 9:
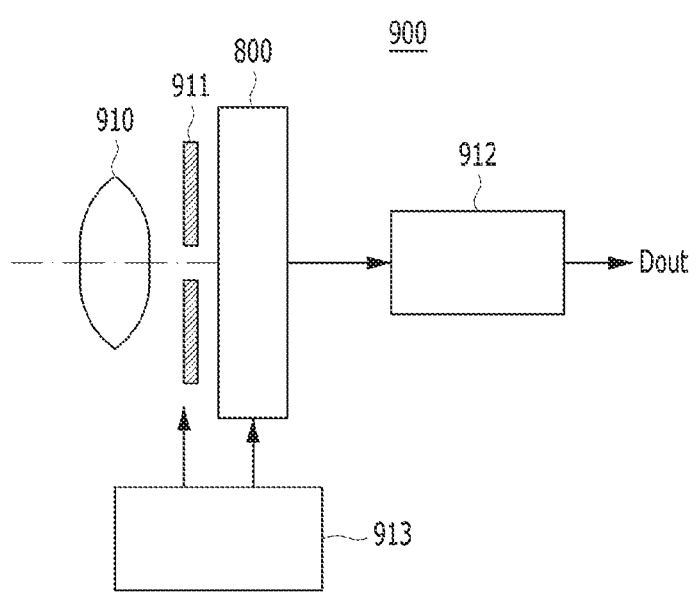
FIG. 9 is a diagram schematically illustrating a representation of an example of an electronic device including one of the image sensors according to the various embodiments of the disclosed technology.

FIG. 9 is a diagram schematically illustrating a representation of an example of an electronic device 900 including one of the image sensors 800 according to the various embodiments of the disclosed technology. Referring to FIG. 9, the electronic device 900 including at least one of the image sensors 800 according to the embodiments may include a camera capable of photographing a still image or a moving image. The electronic device 900 may include an optical system (or an optical lens) 910, a shutter unit 911, a driving circuit 913 which controls/drives the image sensor 800 and the shutter unit 911, and a signal processing circuit 912.

The optical system 910 may guide image light (incident light) from an object, to a pixel array (see the reference numeral 810 of FIG. 1) of the image sensor 800. The optical system 910 may include a plurality of optical lenses. The shutter unit 911 may control a light irradiation period and a light shielding period with respect to the image sensor 800. The driving circuit 913 may control the transmission operation of the image sensor 800 and the shutter operation of the shutter unit 911. The signal processing unit 912 performs various kinds of signal processing for the signal outputted from the image sensor 800. An image signal Dout after signal processing may be stored in a storage medium such as a memory or may be outputted to a monitor or the like.

Although various embodiments have been described for illustrative purposes, it will be apparent to those skilled in the art that various changes and modifications can be further made based on the disclosed technology.

What is claimed is:

1. An image sensor comprising:
a pixel array structured to include different pixel blocks for capturing incident light, wherein each the pixel block includes a block of adjacent unit pixels each unit responsive to light to produce photo-generated charges;
a floating diffusion region disposed at a center of each unit pixel to receive the photo-generated charges; and
transfer gates formed between the floating diffusion region and the unit pixel to control the transfer of the photo-generated charges,
wherein each the pixel block includes an extra floating diffusion region at a center of the pixel block to interface with each of the adjacent unit pixels with the pixel block to photo-generated charges from each of the adjacent unit pixels and extra transfer gates that are formed between the extra floating diffusion region and the adjacent unit pixels to control the transfer of the photo-generated charges from the adjacent unit pixels to the extra floating diffusion region,
wherein each of the floating diffusion regions is larger in size than the extra floating diffusion region.

2. An image sensor comprising:
a pixel array structured to include different pixel blocks for capturing incident light, wherein each the pixel block includes a block of adjacent unit pixels each unit responsive to light to produce photo-generated charges;
a floating diffusion region disposed at a center of each unit pixel to receive the photo-generated charges; and
transfer gates formed between the floating diffusion region and the unit pixel to control the transfer of the photo-generated charges,
wherein each the pixel block includes an extra floating diffusion region at a center of the pixel block to interface with each of the adjacent unit pixels with the pixel block to photo-generated charges from each of the adjacent unit pixels and extra transfer gates that are formed between the extra floating diffusion region and the adjacent unit pixels to control the transfer of the photo-generated charges from the adjacent unit pixels to the extra floating diffusion region,
wherein each extra transfer gate is positioned to spatially overlap with a portion of a corresponding unit pixel and different transfer gates spatially overlap with different corresponding unit pixels, respectively.

3. The image sensor according to claim 2, wherein each extra transfer gate spatially overlaps with a photosensing area of the corresponding unit pixel.

4. The image sensor according to claim 2, wherein the pixel block further includes a plurality of dummy transfer gates which respectively overlap with the photo-sensing regions of the unit pixels without overlapping with the extra transfer gates, each dummy transfer gate being present to improve spatial uniformity in structure in the image sensor and is not connected to perform a circuitry function.

5. The image sensor according to claim 4, wherein the pixel block further includes dummy floating diffusion regions which are disposed between the dummy transfer gates.

6. The image sensor according to claim 1, wherein the unit pixels further include active regions that are disposed on outer surfaces of the unit pixels, respectively, to convert photo-generated charges into pixel signals.

7. The image sensor according to claim 6, wherein at least one of the active regions is electrically coupled with the extra floating diffusion region.

8. The image sensor according to claim 7, wherein the one of the active regions which is electrically coupled with the extra floating diffusion region includes switching elements.

9. The image sensor according to claim 8, wherein the switching elements comprise a first switching element which is electrically coupled with the floating diffusion region of one of the unit pixels, and a second switching element which is electrically coupled with the extra floating diffusion region.

10. The image sensor according to claim 1, wherein the unit pixels includes four adjacent unit pixels in a 2 by 2 matrix and the pixel block further includes:
a first active region disposed on outer surfaces of first and second unit pixels of the four adjacent unit pixels; and
a second active region disposed on outer surfaces of third and fourth unit pixels of the four adjacent unit pixels,
wherein the floating diffusion region of the first unit pixel and the floating diffusion region of the second unit pixel are electrically coupled with the first active region, and
wherein the floating diffusion region of the third unit pixel and the floating diffusion region of the fourth unit pixel are electrically coupled with the second active region.

11. The image sensor according to claim 10, wherein the extra floating diffusion region is electrically coupled with one of the first active region and the second active region.

12. An image sensor comprising:
a pixel block including first to fourth unit pixels which are arranged in rows and columns and extra elements which are disposed at a center of the pixel block,
wherein the first unit pixel comprises first to fourth photosensing elements, first to fourth transfer gates, and a first floating diffusion region,
wherein the second unit pixel comprises first to fourth photosensing elements, first to fourth transfer gates, and a second floating diffusion region,
wherein the third unit pixel comprises first to fourth photosensing elements, first to fourth transfer gates, and a third floating diffusion region,
wherein the fourth unit pixel comprises first to fourth photosensing elements, first to fourth transfer gates, and a fourth floating diffusion region, the first to fourth photosensing elements structured to receive light, and generate photo-charges in response to the reception of light and the first to fourth transfer gates structured to transfer the generated photo-charges to the first to the fourth floating diffusion regions, and
wherein the extra elements comprise:
a first extra transfer gate overlapping with the first unit pixel;
a second extra transfer gate overlapping with the second unit pixel;
a third extra transfer gate overlapping with the third unit pixel;
a fourth extra transfer gate overlapping with the fourth unit pixel; and
an extra floating diffusion region disposed at a center of the pixel block.

13. The image sensor according to claim 12,
wherein the first extra transfer gate overlaps with one of the first to fourth photosensing elements of the first unit pixel,
wherein the second extra transfer gate overlaps with one of the first to fourth photosensing elements of the second unit pixel,
wherein the third extra transfer gate overlaps with one of the first to fourth photosensing elements of the third unit pixel, and
wherein the fourth extra transfer gate overlaps with one of the first to fourth photosensing elements of the fourth unit pixel.

14. The image sensor according to claim 13, wherein the pixel block further includes a plurality of additional transfer gates which overlap with the first to fourth unit pixels.

15. The image sensor according to claim 12,
wherein the pixel block further includes:
a first active region disposed on an outer surface of the first unit pixel and electrically coupled with the first floating diffusion region;
a second active region disposed on an outer surface of the second unit pixel and electrically coupled with the second floating diffusion region;
a third active region disposed on an outer surface of the third unit pixel and electrically coupled with the third floating diffusion region; and
a fourth active region disposed on an outer surface of the fourth unit pixel and electrically coupled with the fourth floating diffusion region, and
wherein the extra floating diffusion region is electrically coupled with one of the first to fourth active regions.

16. The image sensor according to claim 12, wherein the extra elements further comprise an extra gate which is electrically coupled with the extra floating diffusion region.

17. An image sensor comprising:
first to fourth unit pixels arranged in rows and columns, each of the first to fourth unit pixels including photosensing elements structured to detect light and generate photo-charges in a first mode and a floating diffusion region structured to store the generated photo-charges; and
a fifth unit pixel disposed to overlap with the first to fourth unit pixels, and
wherein some of the photosensing elements of the first to fourth unit pixels are included in the fifth unit pixel to detect light and generate photo-charges in a second mode different from the first mode, and wherein the fifth unit pixel includes a floating diffusion region which is disposed at a center of the some of the photosensing elements.

18. The image sensor according to claim 17,
wherein the first unit pixel further comprises first transfer gates which overlap with the photosensing elements of the first unit pixel,
wherein the second unit pixel further comprises second transfer gates which overlap with the photosensing elements of the second unit pixel,
wherein the third unit pixel further comprises third transfer gates which overlap with the photosensing elements of the third unit pixel,
wherein the fourth unit pixel further comprises fourth transfer gates which overlap with the photosensing elements of the fourth unit pixel, and
wherein the fifth unit pixel further comprises extra transfer gates that overlap with the photosensing elements of the first to fourth pixel units.

19. The image sensor according to claim 18,
wherein the photosensing elements of the first to fourth unit pixels overlapped with the extra transfer gates overlap with the first to fourth transfer gates.

20. The image sensor of claim 17, wherein an amount of photo-charges generated during the first mode is greater than that generated during the second mode.

* * * * *